United States Patent
Zorzetto et al.

(10) Patent No.: US 11,499,859 B2
(45) Date of Patent: Nov. 15, 2022

(54) DEVICE FOR DETECTING THE LEVEL OF A MEDIUM

(71) Applicant: ELTEK S.p.A., Casale Monferrato (IT)

(72) Inventors: Mauro Zorzetto, Casale Monferrato (IT); Giorgio Martinengo, Casale Monferrato (IT)

(73) Assignee: ELTEK S.p.A., Casale Monferrato (IT)

( * ) Notice: Subject to any disclaimer, the term of this patent is extended or adjusted under 35 U.S.C. 154(b) by 330 days.

(21) Appl. No.: 16/632,160

(22) PCT Filed: Jul. 13, 2018

(86) PCT No.: PCT/IB2018/055204
§ 371 (c)(1),
(2) Date: Jan. 17, 2020

(87) PCT Pub. No.: WO2019/016660
PCT Pub. Date: Jan. 24, 2019

(65) Prior Publication Data
US 2020/0232835 A1 Jul. 23, 2020

(30) Foreign Application Priority Data
Jul. 20, 2017 (IT) .................. 102017000082600

(51) Int. Cl.
*G01F 23/263* (2022.01)
*H05K 3/28* (2006.01)

(52) U.S. Cl.
CPC .......... *G01F 23/266* (2013.01); *G01F 23/268* (2013.01); *H05K 3/285* (2013.01)

(58) Field of Classification Search
CPC ...... G01F 23/266; G01F 23/268; H05K 3/285
See application file for complete search history.

(56) References Cited

U.S. PATENT DOCUMENTS 6,130,472 A 10/2000 Feger et al.
10,422,681 B2 * 9/2019 Rondano ............... G01F 23/263
(Continued)

FOREIGN PATENT DOCUMENTS

EP   1 316 994   6/2003
GB   2 302 946   2/1997
(Continued)

OTHER PUBLICATIONS

International Search Report and Written Opinion of the ISA for PCT/IB2018/055204 dated Oct. 16, 2018, 13 pages.

*Primary Examiner* — Carl J Arbes
(74) *Attorney, Agent, or Firm* — Nixon & Vanderhye P.C.

(57) ABSTRACT

A capacitive level-sensor device, for detecting the level of a medium contained in a container, is configured for being installed on the outside of the container, in a position substantially resting against a wall of the container that is made at least in part of an electrically insulating material. The circuit support has, in a sensing region thereof, at least one first plurality of first capacitive elements, which comprise at least one first array of first electrodes, preferably set at a distance apart from one another along a level-detection axis, the first electrodes being made of an electrically conductive material and being arranged at least in part in a position corresponding to at least one first side of a supporting structure of the circuit support.
The first electrodes are covered with at least one insulation or protection layer made of an electrically insulating and sealing material, which is selected from materials that include silicon, or its derivatives or compounds, and materials that include fluorine derivatives or compounds.

16 Claims, 23 Drawing Sheets

(56) References Cited

U.S. PATENT DOCUMENTS

2004/0183163 A1    9/2004   Jiang et al.
2009/0139325 A1    6/2009   Cunningham et al.

FOREIGN PATENT DOCUMENTS

WO     2010065564 A   *   6/2010
WO     2015/181770     12/2015

* cited by examiner

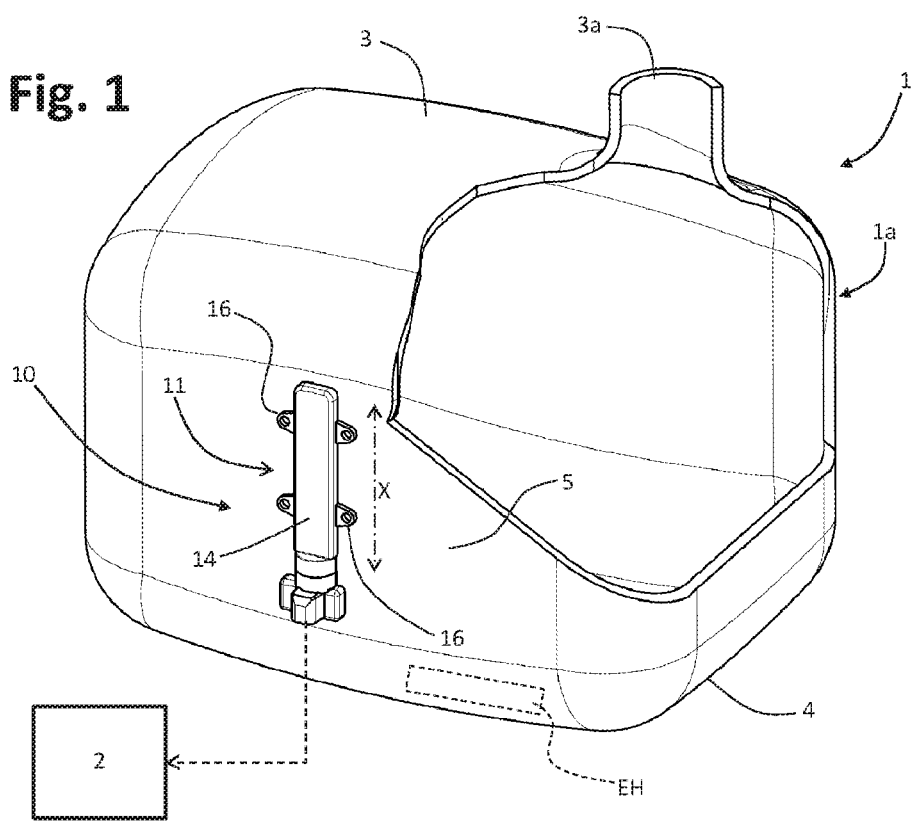

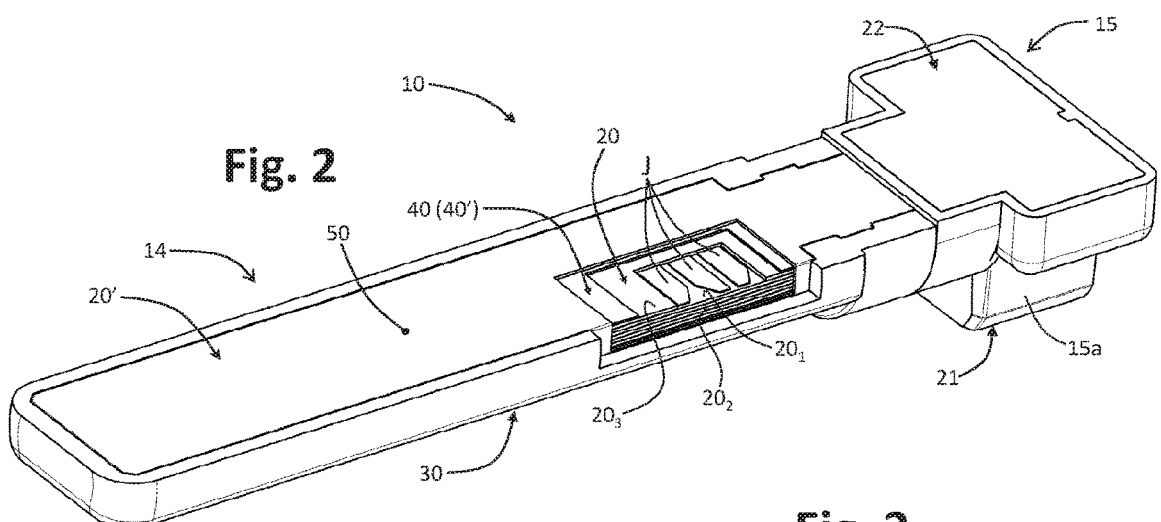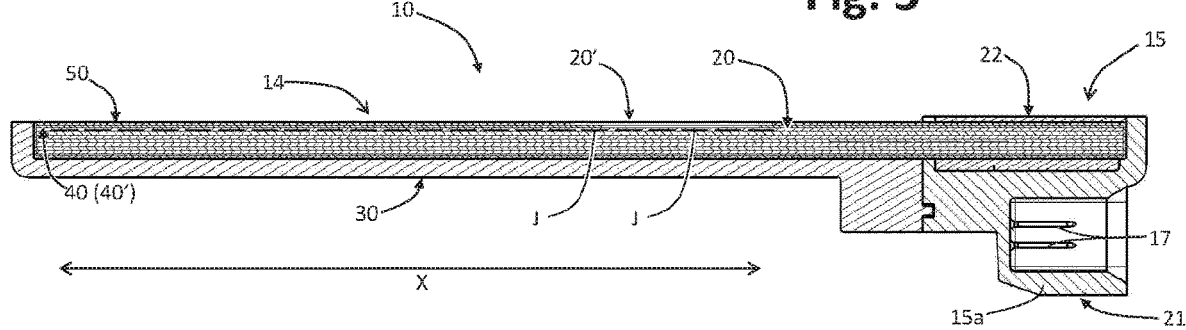

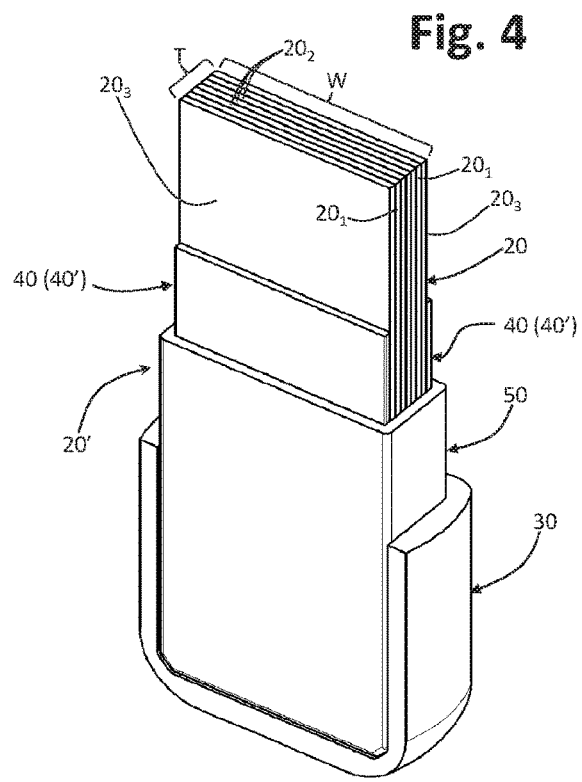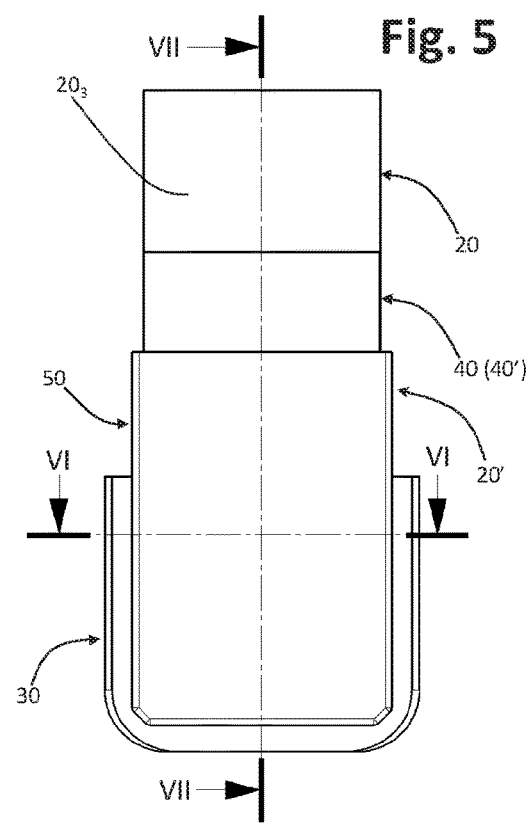

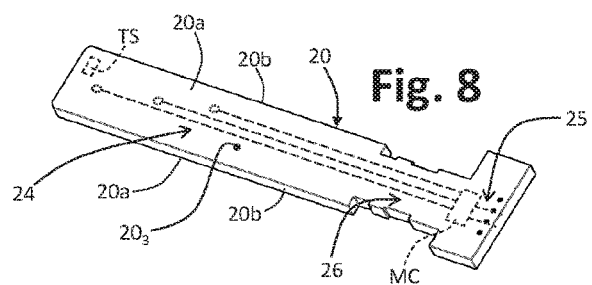
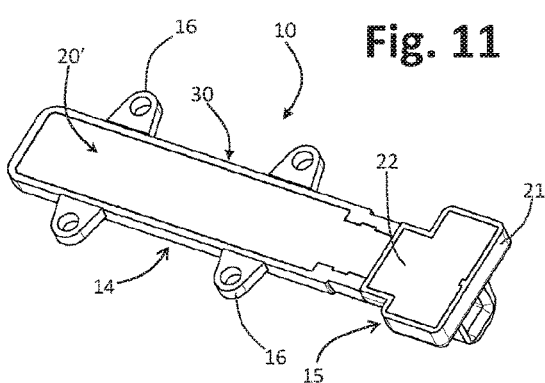
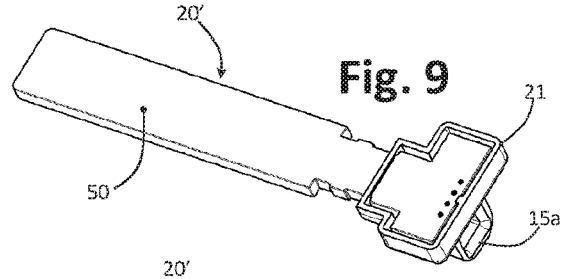
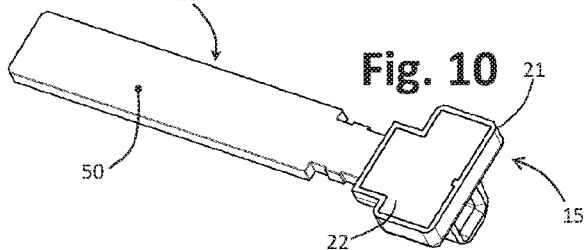
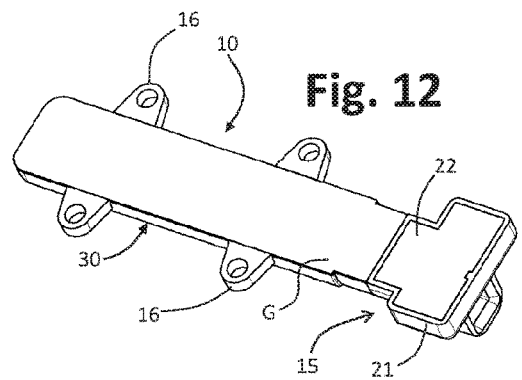

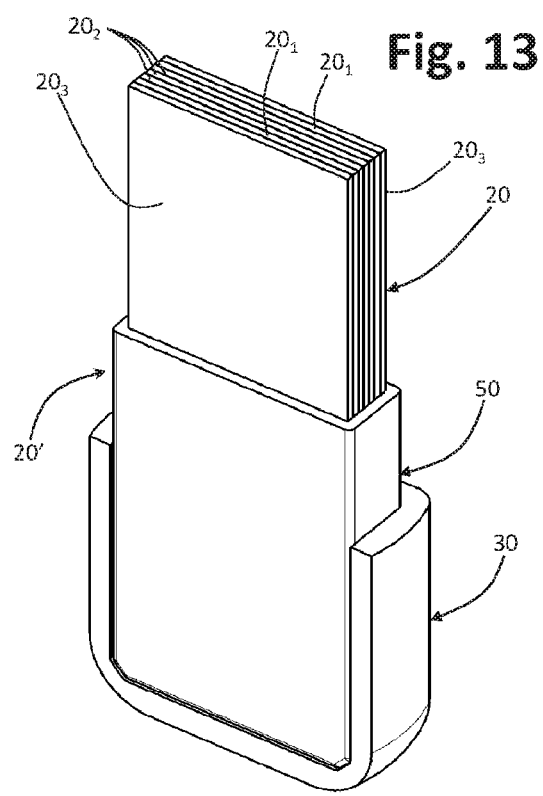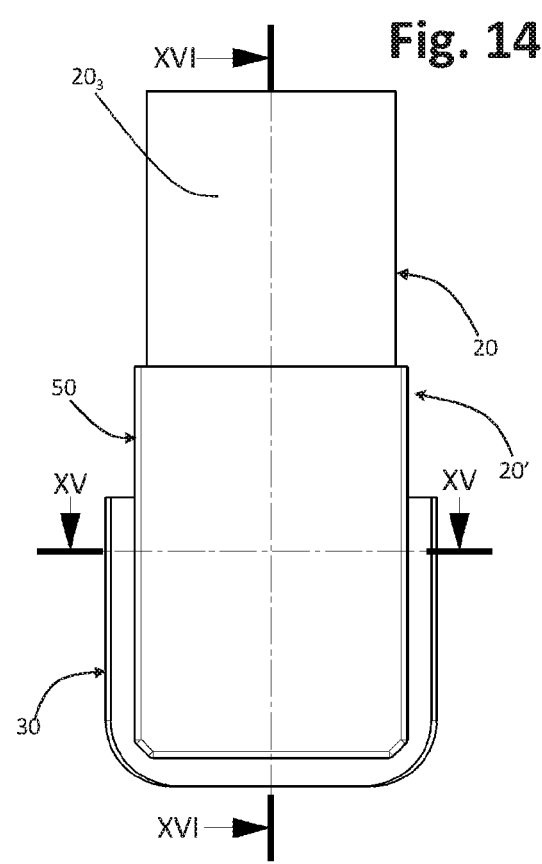

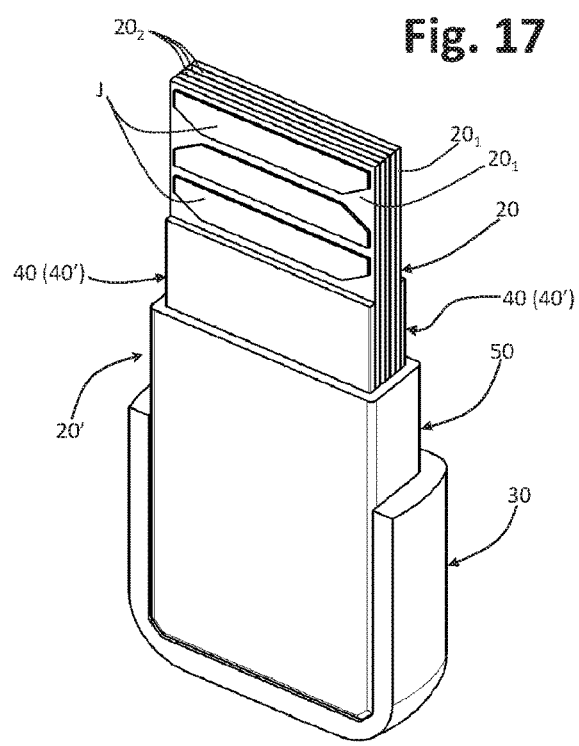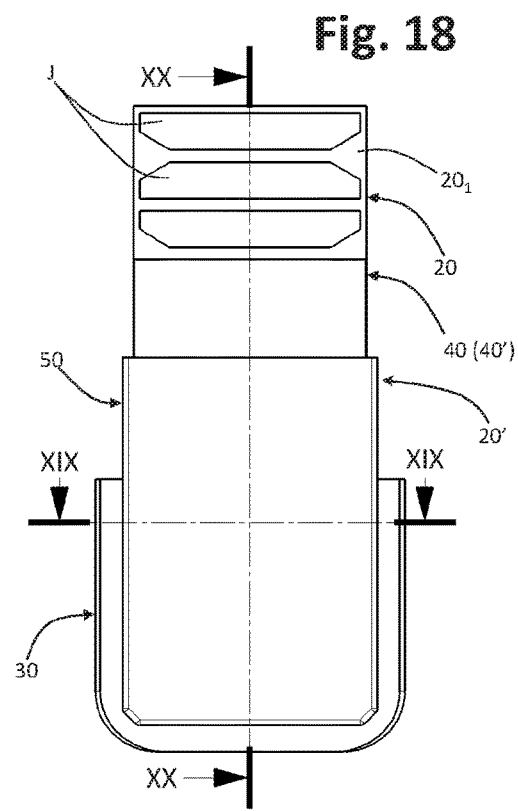

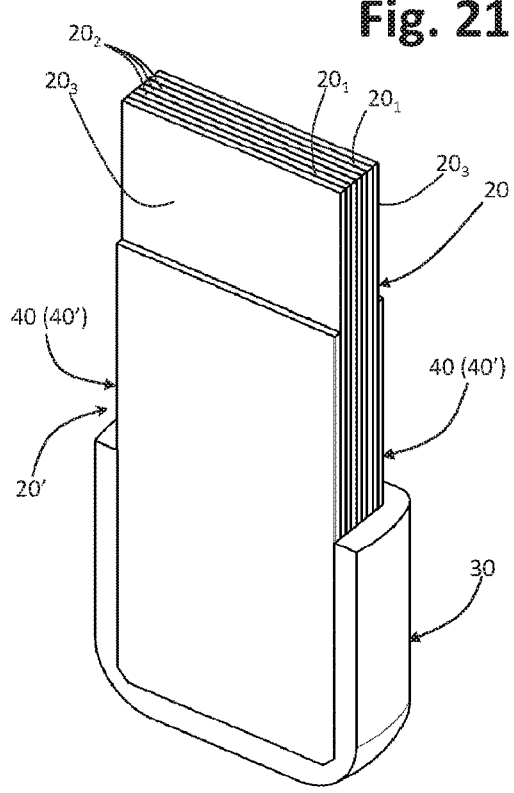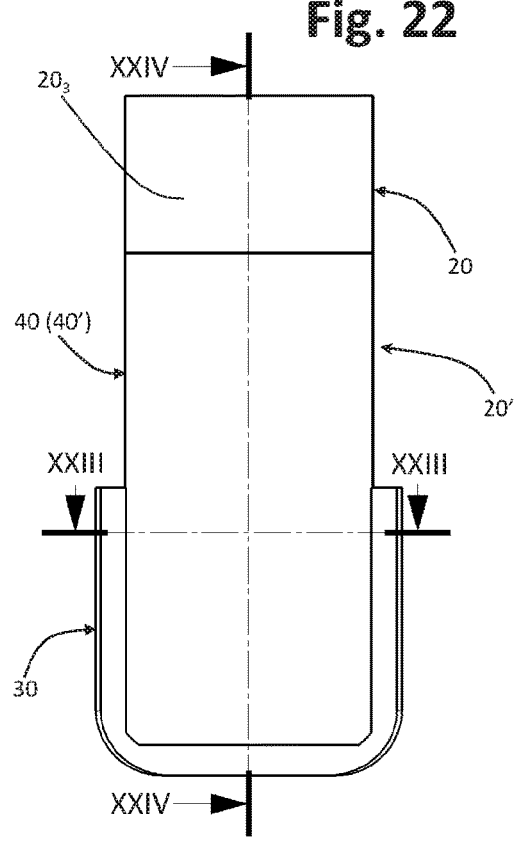

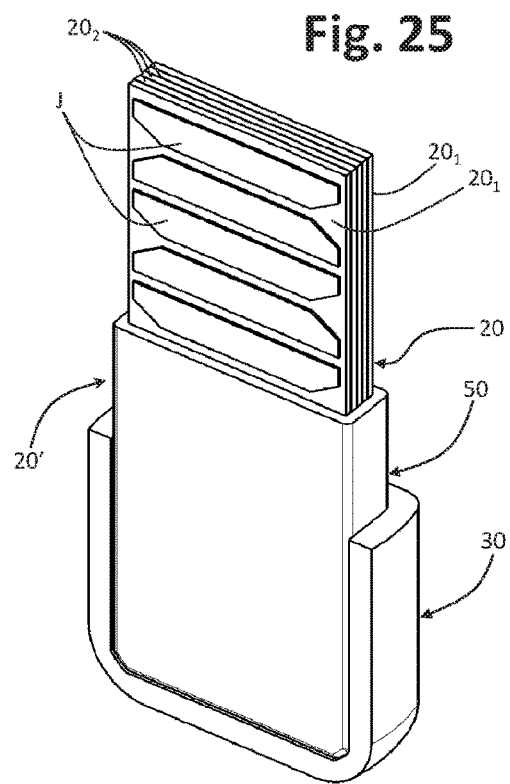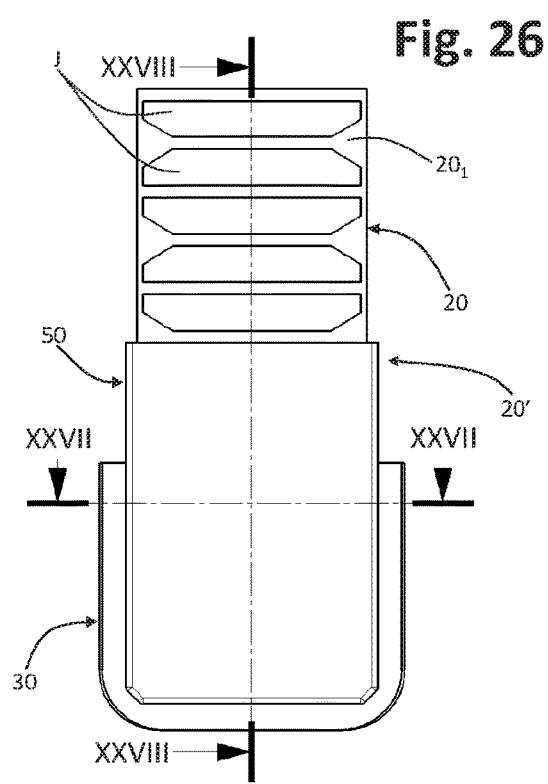

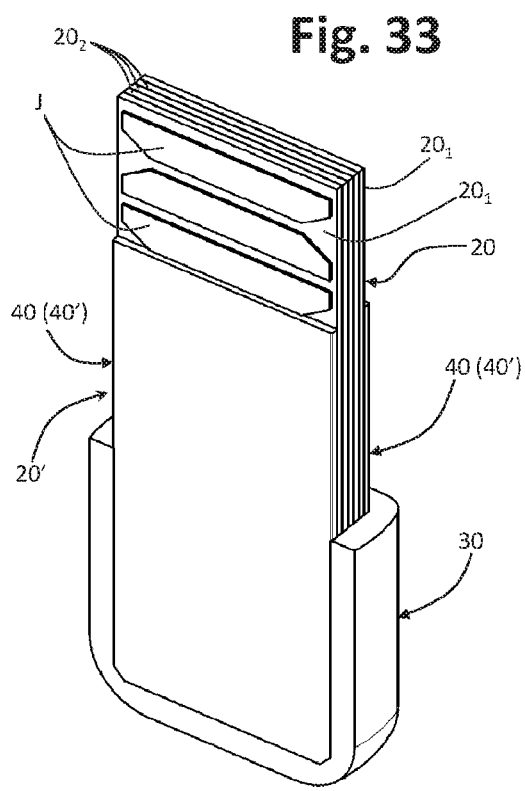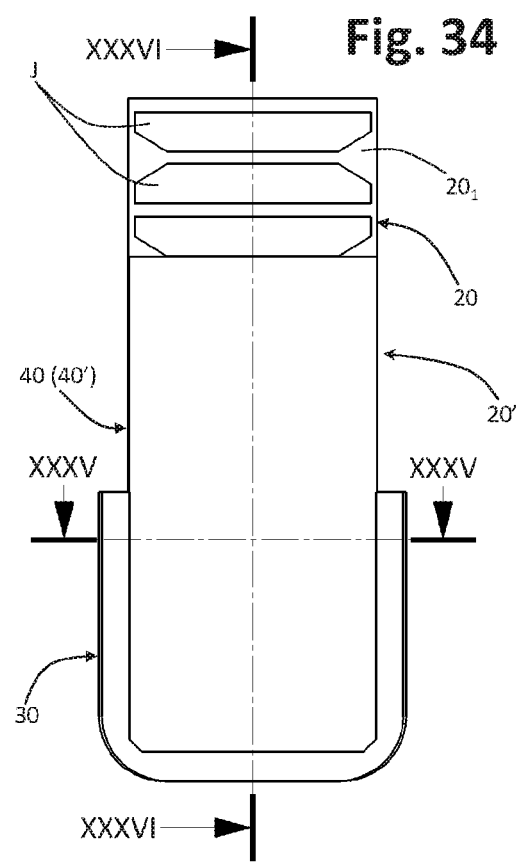

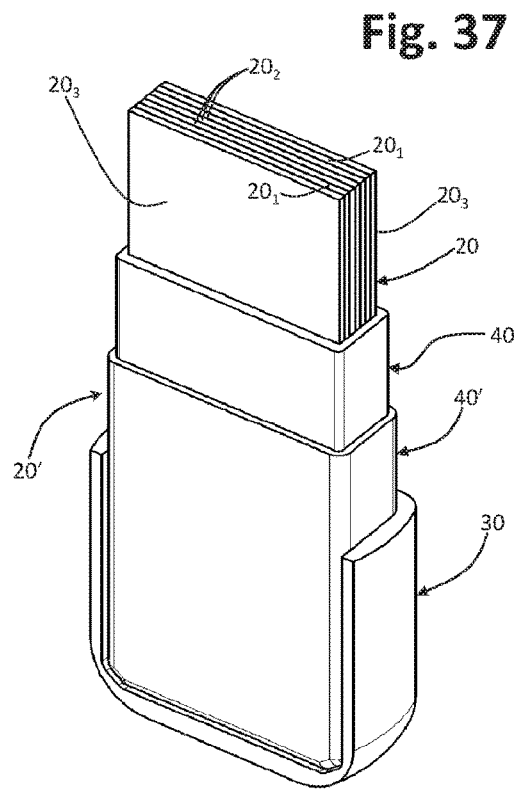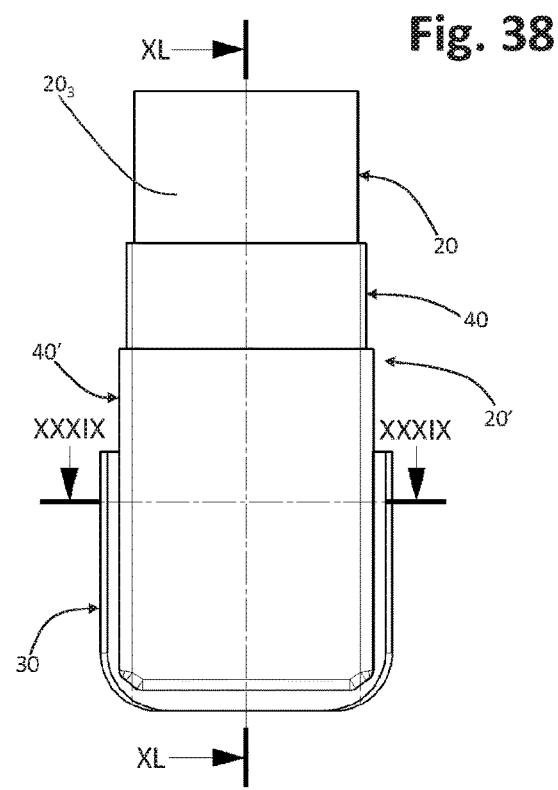

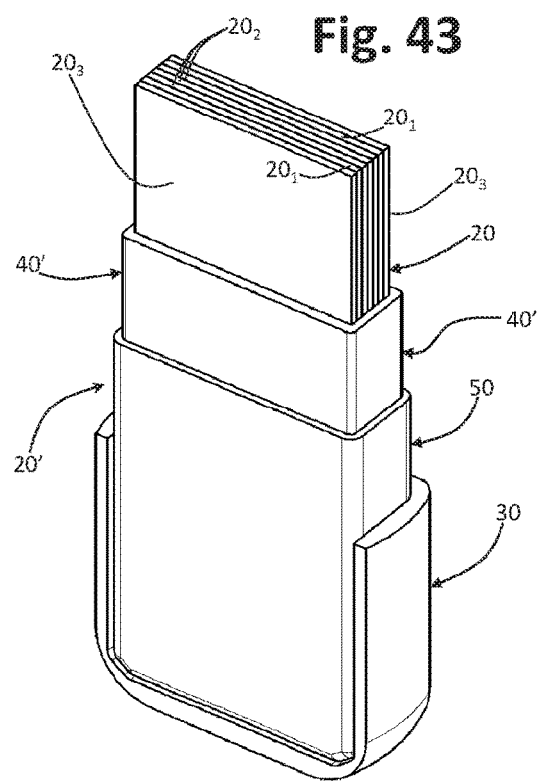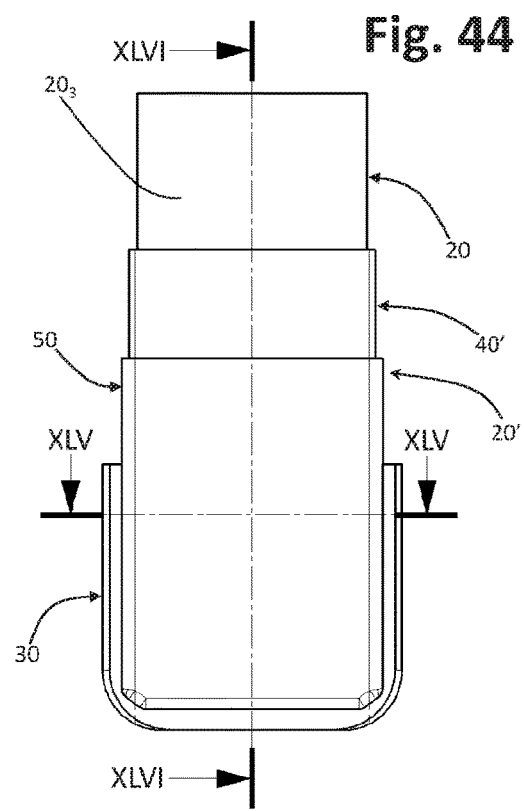

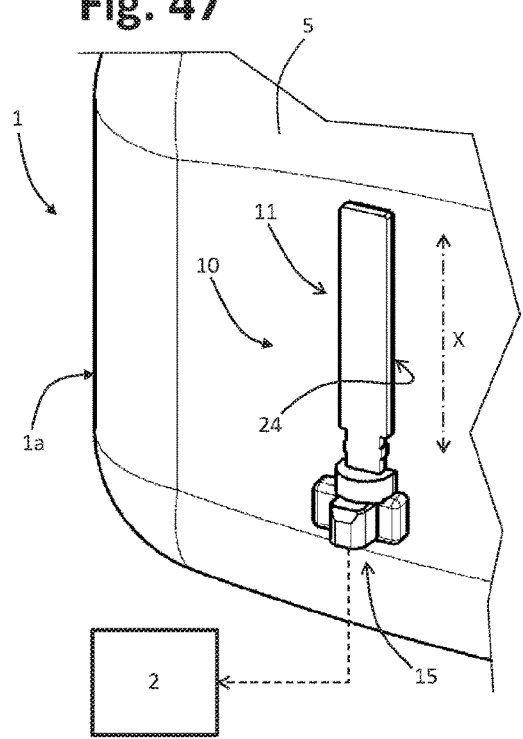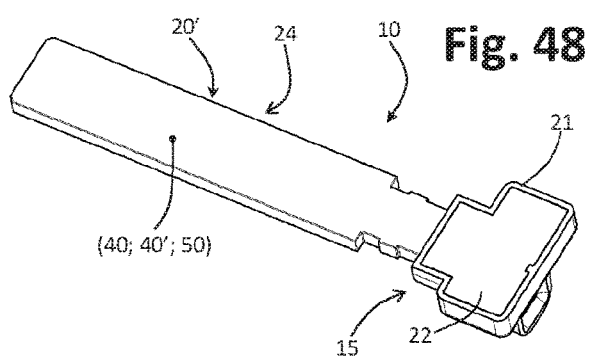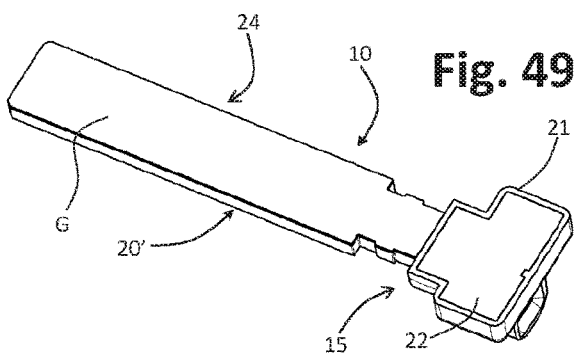

DEVICE FOR DETECTING THE LEVEL OF A MEDIUM

This application is the U.S. national phase of International Application No. PCT/IB2018/055204 filed Jul. 13, 2018 which designated the U.S. and claims priority to IT Patent Application No. 102017000082600 filed Jul. 20, 2017, the entire contents of each of which are hereby incorporated by reference.

FIELD OF THE INVENTION

The present invention relates to a sensor device for detecting the level of a generic medium, such as a liquid, a fluid substance, a powdery material, or a material in the bulk state, etc. The invention has been developed with particular reference to level sensors used on vehicles, preferably level sensors of a capacitive type.

PRIOR ART

A level-sensor device of the type referred to is known, for example, from WO 2015/181770 A, filed in the name of the present Applicant. According to a first embodiment, the device disclosed in WO 2015/181770 has a hollow casing, which is to be immersed in the liquid undergoing detection, partially housed within which is a circuit support or PCB (Printed-Circuit Board). The circuit support carries an array of capacitive detection elements, represented by metal electrodes that are substantially the same as one another and are arranged on the support at a distance apart from one another along a level-detection axis. The hollow casing is configured as a distinct component, obtained via moulding of a thermoplastic material, and subsequently inserted therein is a corresponding portion of the circuit support, which carries the detection electrodes. Then introduced in the cavity of the casing is an electrically non-conductive fluid filling material, such as a polyurethane resin or a gel, preferably a silicone gel. The presence of the aforesaid fluid filling material is mainly aimed at preventing the presence of gaps and air pockets within the cavity, in particular in the micro-cavities determined by the roughness in the area of contact between the circuit support, and/or corresponding electrodes, and the casing, which could have an adverse effect on the level measurement (these concepts are clarified also by the details represented in FIGS. 14 and 15 of the document cited, from which it is evident that the support and/or the electrodes is/are in contact with the casing, and the aforesaid fluid filling material does not form an insulating layer).

The above embodiment of the device has as a consequence that the production process must necessarily envisage prior arrangement of the hollow casing, as well as certain specific operations for insertion of the circuit support in the hollow casing and certain specific operations for introduction of the fluid filling material into the cavity of the casing (in addition, obviously, to management of the supplies and movement of the casing bodies and of the filling material).

According to a second embodiment, WO 2015/181770 envisages replacement of the aforesaid hollow casing with an outer coating, formed by direct overmoulding of plastic material on the circuit support. This type of solution simplifies production of the level-sensor device as a whole, but implies in time a decay of its precision of detection, following upon the presence of humidity around the detection electrodes.

The present Applicant has in fact noted that, following upon use of the device, the overmoulded plastic material of the outer coating tends to absorb humidity, on account of the practically constant contact with the liquid undergoing detection. This humidity, the negative effects of which appear with the passage of time, leads to imprecisions of detection already in the course of the service life of the device. The same problem is present also in devices built according to the aforesaid first embodiment of WO 2015/181770, given that its hollow casing is configured for pressing the circuit support against a wall delimited by the corresponding housing cavity so that the electrodes are in strict contact with the wall, which is itself liable to absorb humidity in time.

The sensitivity of the capacitive measurement is maximum if a liquid is set on the surface of the detection electrode and decreases (substantially exponentially) as of the distance between the liquid and the surface of the electrode increases linearly. The same behaviour occurs, however, if, instead of the liquid, water vapour or humidity in general is present. In other words, the presence of humidity in the material of the hollow casing or of the overmoulded coating, and hence on the electrodes in contact with the aforesaid material, has the effect of "emulating" the presence of liquid, thereby vitiating to a certain extent the level-sensing precision.

An overmoulded coating may be formed using a plastic material having good barrier properties and good properties of resistance to humidity. However, materials of this type are in general costly and difficult to process for the purposes of formation of the overmoulded coating (the sensing part of the device is in general rather long, which renders difficult the operation of overmoulding using certain polymers).

The present Applicant has moreover found that certain polymers that present good barrier properties and good properties of resistance to humidity have the drawback of presenting considerable shrinkage, and/or dimensional deformations following upon the moulding operations, and/or on account of expansion and thermal shock. This may cause faults in a circuit support (i.e., in the corresponding electrical paths, and/or electrodes, and/or electronic components) on which such a polymer is directly overmoulded. In any case, also these materials are inevitably subject to absorbing humidity in the long term, following upon prolonged contact with the liquid undergoing detection.

On the other hand, the overmoulded coating may be obtained using other types of plastic materials (for example, certain thermoplastic polymers), which are less expensive and more easily mouldable. These materials in general present, however, poorer characteristics of resistance to humidity, and hence a faster decay of the precision of level sensing by the device.

According to a third embodiment, WO 2015/181770 suggests arrangement of the sensor device on the outside of the container containing the medium undergoing detection, i.e., on a side wall thereof, with the array of electrodes facing the wall, which hence electrically insulates the electrodes themselves from the medium undergoing detection. In this embodiment, the body of the sensor device 10 has an outer casing open laterally so that the electrodes face, and/or are set up against, a respective portion of the aforesaid side wall.

In solutions of this type, however, the detection electrodes can potentially be reached by external agents that may have a negative effect on the precision and reliability of the level measurement. Such external agents may be represented by environmental humidity (consider, for example, the case of use of a vehicle in a foggy area or in the presence of rain, snow, etc.), or by vapours that may develop in the environment where the device is installed (for example, following upon running of the engine of a vehicle), or again by other liquids that may be present in the environment (such as rain water that reaches the device, or other liquids that reach it accidentally in the course of topping up of a tank to which the device is associated). It will be appreciated that, in the case where the measurement electrodes are reached, also the aforementioned external agents may cause negative effects resembling those described previously in relation to absorption of humidity or liquid by a casing that insulates the device from the medium undergoing detection. The external agents that may cause imprecision of detection in a device according to the third embodiment of WO 2015/181770 may also include dust, powder, or particles dispersed in the environment that may reach the measurement electrodes, such as particulate or particles of friction material, especially when it is of small dimensions (micrometric or nanometric dimensions) and includes electrically conductive material. Environmental dust, powder, and liquids that possibly reach the measurement electrodes could also chemically combine together, for example to produce compounds that are potentially corrosive or in any case harmful. These dusts and liquids, individually or in combination, could also form substances or electrolytes that alter or prevent operation of the device, for example causing parasitic electrical resistances or shortcircuits between the electrodes.

SUMMARY AND AIM OF THE INVENTION

In view of what has been set forth above, the object of the present invention is to provide a capacitive level-sensor device of the type that is designed to be mounted on the outside of a container containing the medium undergoing detection, in particular on an outer wall of the container, that is built in a simple and economically advantageous way, but is distinguished by an increased precision, sensitivity, and reliability of detection in the long term, as compared to known devices designed for similar applications. The above and other aims still, which will emerge more clearly hereinafter, are achieved according to the invention by a level-sensor device having the characteristics specified in the annexed claims. The claims form an integral part of the technical teaching provided herein in relation to the invention.

BRIEF DESCRIPTION OF THE DRAWINGS

Further aims, characteristics, and advantages of the invention will emerge from the ensuing description, with reference to the annexed drawings, which are provided purely by way of non-limiting example and in which:

FIG. 1 is a perspective sectioned view of a generic container that comprises a level-sensor device according to possible embodiments of the invention;

FIG. 2 is a partially sectioned schematic perspective view of a level-sensor device according to possible embodiments of the invention;

FIG. 3 is a schematic longitudinal section of a level-sensor device according to possible embodiments of the invention;

FIGS. 4 and 5 are schematic views, respectively a perspective view and a front elevation, of a level-sensor device according to possible embodiments of the invention;

FIGS. 8-12 illustrate, via schematic perspective views, a possible sequence of assembly of a level-sensor device according to possible embodiments of the invention;

FIGS. 13 and 14 are schematic views similar to those of FIGS. 4 and 5, regarding a level-sensor device according to further possible embodiments of the invention;

FIGS. 17 and 18 are schematic views similar to those of FIGS. 4 and 5, regarding a level-sensor device according to further possible embodiments of the invention;

FIGS. 21 and 22 are schematic views similar to those of FIGS. 4 and 5, regarding a level-sensor device according to further possible embodiments of the invention;

FIGS. 25 and 26 are schematic views similar to those of FIGS. 4 and 5, regarding a level-sensor device according to further possible embodiments of the invention;

FIGS. 33 and 34 are schematic views similar to those of FIGS. 4 and 5, regarding a level-sensor device according to further possible embodiments of the invention;

FIGS. 37 and 38 are schematic views similar to those of FIGS. 4 and 5, regarding a level-sensor device according to further possible embodiments of the invention;

FIGS. 43 and 44 are schematic views similar to those of FIGS. 4 and 5, regarding a level-sensor device according to further possible embodiments of the invention;

FIG. 47 is a view similar to that of FIG. 1, regarding a level-sensor device according to possible variant embodiments of the invention; and FIGS. 48 and 49 are schematic perspective views of level-sensor devices suitable for the application illustrated in FIG. 47.

DESCRIPTION OF PREFERRED EMBODIMENTS OF THE INVENTION

Figure 6:
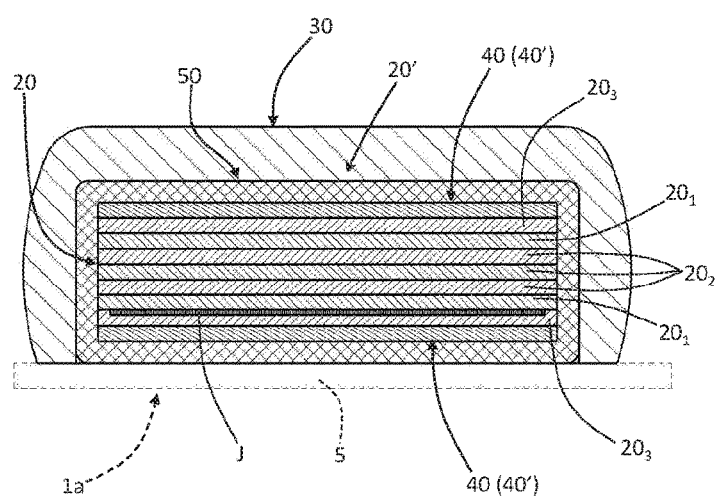
FIGS. 6 and 7 are schematic cross-sectional views according the lines VI-VI and VII-VII, respectively, of FIG. 5.

Reference to "an embodiment", "one embodiment", or "various embodiments" and the like, in the framework of the present description is intended to indicate that at least one detail, configuration, structure, or characteristic described in relation to the embodiment is comprised in at least one embodiment. Hence, phrases such as "in an embodiment", "in one embodiment", "in various embodiments", and the like, that may be present in various points of the present description do not necessarily refer to one and the same embodiment, but may instead refer to different embodiments. Moreover, particular conformations, structures, or characteristics defined in this description may be combined in any adequate way in one or more embodiments, even different from the ones represented. The reference numbers and spatial references (such as "upper", "lower", "top", "bottom", "front", "back", "vertical", etc.) used herein, in particular with reference to the examples in the figures, are provided merely for convenience and hence do not define the sphere of protection or the scope of the embodiments. In the present description and in the attached claims, the generic term "material" is to be understood as including also mixtures, compositions, or combinations of a number of different materials. In the figures, the same reference numbers are used to designate elements that are similar or technically equivalent to one another.

In FIG. 1, designated as a whole by 1 is a generic container of a generic substance, in particular a tank of a motor vehicle. The container may, for example, be a tank that is to contain a liquid, for example a fuel, or water, or an additive. In various embodiments, the container 1 (defined hereinafter for simplicity also as "tank") is designed to contain water required for operation of a system of an internal-combustion engine, or else an additive or reducing agent required for the operation of a system for the treatment of the exhaust gases of an internal-combustion engine. Such a system served by the tank 1 is designated by 2. The treatment system 2 may, for example, be an ADI (Anti-Detonant Injection) system, in which case the tank 1 will contain water, or else an SCR (Selective Catalytic Reduction) system, in which case the tank 1 will contain a solution of urea in aqueous solution, such as the one commercially known by the name AdBlue™. In both cases, the liquid is liable to freeze when the tank 1 is exposed to low temperatures (indicatively temperatures lower than 0° C.). For this reason, the tank 1 may be equipped with a heater device. The container 1 could, however, be used for other purposes, and/or in sectors different from the automotive one, and could be designed to contain a different substance.

The main body 1a of the tank 1 may be made of any electrically insulating material, in particular a material that is chemically resistant to the substance contained, for example a suitable plastic material according to known technique, such as a high-density polyethylene (HDPE). To the tank 1 there may possibly be associated a heater of a type in itself known, used for heating the tank itself, and/or its contents, for example in the event of freezing. An electrical heater is represented schematically in the figures by the block designated by EH.

In the schematic example illustrated, the tank 1 has an upper part 3, for example an upper wall thereof, where an opening 3a is provided for topping-up of the liquid substance. A lower part 4 of the tank 1, for example a bottom wall thereof, has an outlet opening (not visible), via which the solution exits or is drawn out, for example via a pump, for supplying the liquid to the system 2. The tank 1 has a peripheral or side wall, designated by 5, fixed on the outer side of which is the body of a sensor device according to various possible embodiments of the invention. In various preferred embodiments, in fact, a sensor device according to the invention is to be installed on the outside of a generic container, or else is configured for being installed on the outside of a container containing the medium undergoing level sensing, in a position preferably resting on (possibly even directly in contact with or set up against) a wall of the container that is made at least in part of an electrically insulating material, so that at least this wall is set between the sensor device and the liquid substance undergoing detection. The term "resting" is not to be understood in the sense that the structure itself of the sensor device is directly in contact with the aforesaid wall of the container: as will be seen, in fact, in various embodiments, between at least part of the sensor device (in particular its sensing part) and the aforesaid wall of the container there may be set a further material, such as an adhesive or a bonding agent, preferably designed to fix or hold the sensor device in position with respect to the wall of the container.

The sensor device, designated as a whole by 10, includes a level-detection part 11, designed to extend on the outside of the tank 1, in particular according to a level-detection axis X, which is preferably substantially vertical (but, if need be, it may be inclined with respect to the vertical). Preferentially, a proximal end region of the detection part 11 extends on the outside of the tank 1 at a height relatively close to the bottom wall 4 in order to be able to detect the presence of an even very low level of liquid in the tank. It should be noted that the device 10 according to the invention may form, or be associated to, or be integrated in, a further body or component that is mounted on the outside of the tank 1, for example a component that comprises at least one heater device.

In FIGS. 2 and 3, a device 10 according to possible embodiments is represented in isolation, via a perspective view partially sectioned and a view in longitudinal section. In the case exemplified, the device 10 has a casing body that comprises at least one detection portion 14, which is made of electrically insulating material and prevalently belongs to the detection part 11 of the device 10 (FIG. 1). As will emerge clearly hereinafter, the presence of the aforesaid casing body, or at least of its detection portion 14, does not constitute an essential characteristic of the invention.

In various embodiments, the casing body of the device comprises a connection and/or control portion 15 (hereinafter referred to for simplicity as "connection portion"), for electrical connection of the device 10 to an external system, for example, a control unit belonging to the system 2 of FIG. 1.

In various embodiments, the aforesaid casing body is prearranged for performing also functions of fixing of the device in the operating position, for example, on the outer side of the peripheral wall 5 of the tank 1 of FIG. 1. For this purpose, in various preferred embodiments, the casing body has fixing elements 16, which, as exemplified in FIG. 1, may comprise one or more brackets, preferably formed integrally with a coating belonging to the casing body (the representation of these brackets 16 has been omitted in various figures, for reasons of greater clarity).

In various embodiments, the connection and/or control portion 15 includes a generally hollow connector body 15a, extending in which are respective portions of electrical terminals, partially visible in FIG. 3, where they are designated by 17. In various embodiments, the terminals 17, for example obtained via stamping or blanking from metal strap, form, with the connector body 15a, an interface for external connection of the device 10, for example to the aforesaid control unit of the system 2. Preferentially, each terminal 17 has a contact portion, preferably a lamina portion, designed for being positioned within the cavity of the connector body 15a, and an interconnection portion, which is preferably narrow, designed for electrical and mechanical coupling with respective contact elements, for example present on a circuit support or substrate described hereinafter.

Partially visible in FIGS. 2 and 3 is also a circuit support or PCB (Printed Circuit Board), designated as a whole by 20, which in the non-limiting example illustrated extends at least in the detection portion 14 of the casing body of the device, and preferably also in the connection and/or control portion 15.

In these figures, designated by 21 and 22 are two body parts, which are to be joined together with interposition of a proximal end portion of the PCB 20, the part 22 possibly being obtained at least in part via overmoulding or resin deposition. The body part 21 could be a half-shell moulded separately, and then mounted on the PCB 20 with subsequent resin deposition or overmoulding to provide the body part 22.

In the example of FIG. 3, the parts 21 and 22 form at least partially the connection portion 15 of the casing body, with the part 21 that preferentially defines the connector body 15a and integrates the electrical terminals 17. The portion 15 of the casing body of the device 10 could also be formed in some other way, for example with the parts 21, and/or 22, and/or the portion 15 made of the same material as a casing of the device, and/or as integral part of this casing, possibly at least in part overmoulded.

In the example represented, the detection portion 14 comprises an outer casing 30, which is preferably made of an electrically insulating material. The outer casing 30, i.e., the material that forms it, defines a sort of shell belonging to the casing body of the device 10, which is designed to enclose only partially a detection region of the PCB 20, on the side opposite to the container 1. The outer casing 30, when envisaged, may be configured as element overmoulded at least in part on the PCB 20, or else as an element produced in itself and then coupled to the PCB 20.

Provided on the PCB 20 is at least part of the necessary electrical-connection elements (such as leads or electrical paths), and/or of the electrical and/or electronic componentry necessary for level detection. The PCB 20 has a load-bearing structure, or supporting structure, made of electrically insulating material, suitable for producing printed circuits. In various embodiments, the PCB 20 is formed using at least one composite material that includes glass fibres, i.e., silicon oxide, preferably a composite material having a matrix of epoxy resin, in which glass fibres are included, where the glass fibres are arranged to form a sort of non-woven fabric impregnated with the resin. Materials that are preferred in this sense are for example FR4, vetronite, and similar electrically insulating composite materials, such GRP (Glass-Reinforced Plastic). On the other hand, as will be seen hereinafter, not excluded from the scope of the invention is the use of other materials for obtaining the supporting structure of the PCB 20, such as ceramic or polymer-based materials, not necessarily composites, and/or materials including silicon or its derivatives or compounds.

The PCB 20 extends longitudinally between two ends along the level-detection axis X and has a generally flattened shape, which includes two opposite major sides (designated by 20a only in FIG. 8), which define between them a PCB thickness T (indicated only in FIG. 4), and two opposite longitudinal edges (designated by 20b only in FIG. 8), which define between them a PCB width W (indicated only in FIG. 4).

In the PCB 20—represented in isolation in FIG. 8—it is possible to identify a detection region 24, which belongs to the detection part 11 of the device 10 and includes the distal end of the PCB itself, as well as a second region 25, hereinafter also defined for simplicity as "control and/or connection region", which includes the proximal end of the PCB. Between the two regions 24 and 25 there may possibly be provided also an intermediate region, such as the one designated by 26 in FIG. 8.

To the region 25 of the PCB 20 there may be associated at least part of the electrical and electronic processing and/or control componentry of the device 10, and associated thereto are the terminals 17 (FIG. 3) for external electrical connection of the device 10. Instead, associated prevalently to the region 24 of the PCB 20 is the level-detection componentry. More in particular, associated to the region 24 is at least one first array of capacitive elements, which comprises at least one first series of first electrodes in a position corresponding to a major side of the PCB (for example, the major side hereinafter identified by a layer $20_3$ or a layer $20_1$, according to the embodiment considered). It should be noted that phrases such as "in a position corresponding to a major side" or "at a major side" used with reference to the electrodes, and present also in the sequel of the present description and in the attached claims, do not necessarily imply that the electrodes referred to are arranged on the outside of the aforesaid side, i.e., on an outer face thereof. In various preferred embodiments, in themselves autonomously inventive, the PCB 20 is a PCB of a so-called multilayer type, i.e., a circuit support having a multilayer supporting structure that comprises a plurality of layers of electrically insulating material, for example laminated on one another, with the aforesaid electrodes that are arranged between two layers of electrically insulating material of the structure.

In traditional multilayer PCBs, defined on one or more of the intermediate layers are corresponding electrically conductive paths, and possibly also other active and/or passive components of an electrical circuit arrangement, which are then "enclosed" within the multilayer structure, the paths and/or circuit components present on one layer being possibly electrically connected to paths and/or circuit components present on another layer via so-called metallized "vias" or holes.

According to an inventive solution proposed herein, used in the level-sensor device is a multilayer PCB 20 that integrates inside it at least one first array of first electrodes used for capacitive level detection, i.e., in such a way that—between the aforementioned first electrodes and the peripheral wall 5 of the tank 1 (FIG. 1), or more in general, the outside of the device—at least one layer of the multilayer structure of the PCB 20 is present. Such a case is exemplified in FIGS. 2-3, where some of the aforesaid first detection electrodes are designated by the letter "J" (in FIG. 8 these electrodes are not visible in so far as they are covered by an outer layer $20_3$ of the PCB 20). According to variants not represented, the various configurations described with reference to multilayer circuit supports or PCBs with internal electrodes could be obtained also in some other way, not necessarily envisaging a support with a number of layers, for example, envisaging a plurality of electrodes and electrically conductive paths, such as shaped metal straps, then overmoulded with an electrically insulating polymer that provides the supporting structure for the electrodes and other circuit elements (conductive paths, metallized holes or vias, electrical and/or electronic components, etc.). As will be seen, in any case, according to other embodiments, the PCB 20 is preferably of a multilayer type, and/or its detection electrodes may be arranged on the outside of at least one of its sides, preferably at least one of its major sides.

In various embodiments, the electrodes J of the aforesaid first array are substantially the same as one another and are set at a distance apart from one another along the level-detection axis X, in a predefined and preferably homogeneous way. According to possible embodiments (not illustrated), however, one and the same array of capacitive elements may also include a number of different series of electrodes, the electrodes of one series having a geometry different from that of the electrodes of another series of the same array. In other embodiments, the electrodes could have a shape elongated in the direction of the level-detection axis X.

In various embodiments, the electrodes J are connected individually to respective inputs of a controller—represented schematically in FIG. 8, where it is designated by MC—that belongs to the control circuitry and that, for example, is positioned in the region 25 of the PCB 20. Not excluded, however, is the case of connection of a number of electrodes J in parallel to one another to one and the same input of the aforesaid controller. Preferably, the electrodes J have geometrical shapes that are the same as one another, or else have different shapes but the same surface dimensions or, in general, have the same electrical capacitance. The electrodes J extend preferentially in a direction transverse to the PCB 20 or to the level-detection axis X.

The electrodes J are made of electrically conductive material, for example a metal material or a metal alloy. The electrodes J are preferably coplanar with respect to one another, within the corresponding array, and may, for example, be in the form of plates or laminas sunk in or applied on the supporting structure of the PCB 20, or else may be constituted by an electrically conductive layer deposited on the supporting structure of the PCB 20, for example using a silk-screen printing technique or the like. In various embodiments, the PCB 20, or at least one of its layers, has vias or through holes containing electrically conductive material, for electrical connection of the electrodes J together, and/or to corresponding conductive connection paths, and/or to possible other electrical and/or electronic components present in the PCB 20.

The region 25 of the PCB 20 is preferably comprised between the proximal end of the PCB itself and the first electrode J of the corresponding array (in this perspective, the connection and/or control region 25 may hence include also the area corresponding to the intermediate region designated by 26 in FIG. 8). However, also included in the scope of the invention is the case where electrical and/or electronic control and/or processing components belonging to the circuit arrangement of the device 10 are arranged along the entire PCB 20 or within its detection region 24, i.e., in the proximity of, and/or between the electrodes J. In this perspective, the connection and/or control region 25 may extend even substantially throughout the length of the PCB 20, with a part thereof in common with the detection region 24. As has been said, in particular in the case of a PCB 20 of the type exemplified, i.e., having a multilayer structure, also at least some of the aforesaid electrical and/or electronic control and/or processing components may be arranged between two layers of electrically insulating material of the multilayer structure.

As already mentioned, in various embodiments, the components belonging to the measurement circuit arrangement that equips the device 10 include at least one control unit or controller MC (for example, selected from, or comprising at least one from among, a microcontroller, a microprocessor, a CPU, a DSP—Digital-Signal Processor, a memory, an integrated circuit, an operational circuit, an A/D converter circuit, an electronic switching circuit), as well as further active and/or passive components (such as transistors, MOSFETs, resistors, capacitors, diodes, etc.).

In various embodiments, the controller MC has a plurality of inputs to which the electrodes J are connected individually, or else a number of electrodes J in parallel to one another are connected to one and the same input of the controller MC. The controller MC preferably comprises at least one processing logic unit, a memory, and inputs and outputs, amongst which inputs of an analog/digital type. The controller MC may, for example, be a microprocessor identified by the code PIC16F1517 manufactured by Microchip Technology Inc. or a microprocessor identified by the code of the series CY8C4200M manufactured by Cypress Semiconductor Corporation. The specific level-detection modalities implemented by the device 10 by means of the electrodes J, of a capacitive type, may, however, be of any type known in the sector, for example according to the teachings of any of documents WO2015/181770, WO2016/042456, and WO2016/042459 filed in the name of the present Applicant.

As has been mentioned, provided in the PCB 20 are electrically conductive paths, for connection of various circuit elements, such as the electrodes J, the possible further electrical and/or electronic components, and the terminals 17 (some of these paths are represented schematically in FIG. 8 via dashed lines that depart from the controller MC). As has been said, the PCB 20 may present also metallized vias or holes (represented schematically by dashed circles in FIG. 8), for connecting together different conductive paths, and/or for connecting conductive paths and/or circuit components provided in different layers or parts of the PCB 20, to the outside world and/or internally. As has been said, in fact, in various preferential embodiments, the PCB 20 is a PCB with multilayer supporting structure, where the aforesaid paths may be provided on internal or intermediate layers of the PCB itself.

In various embodiments, the sensor device according to the invention includes at least one further sensor means for detecting at least one further quantity different from the level of a substance. The further sensor means may, for example, be selected from temperature sensors and optical sensors designed to detect qualitative characteristics, and/or characteristics of composition, and/or chemico-physical characteristics of the fluid. For instance, in various embodiments, the circuit arrangement of the device 10 includes at least one temperature sensor, in particular a sensor with temperature-variable electrical resistance, such as a sensor of an NTC or PTC type. Such a sensor may be mounted in a position corresponding to at least one from among the proximal end area, the distal end area, and an intermediate area of the detection region 24 of the PCB 20, in its part facing the peripheral wall 5 of the tank 1 (FIG. 1). Such a temperature sensor is represented schematically by block TS in FIG. 8.

According to an aspect of the present invention, at least the detection electrodes J, and preferably a corresponding part of the PCB 20, are covered or protected with at least one layer for insulation or protection from external agents, including environmental dirt, the layer being preferentially made of electrically insulating and fluid-tight material, the purpose being to prevent or delay external agents that could have a negative effect on operation of the device or on the level-measurement precision from reaching of the electrodes. As explained in the introductory part of the present description, the external agents may, for example, be constituted by environmental humidity, and/or generic vapours that might develop in the area where the device 10 is installed, or else liquids or powders or generic dirt that might reach this area, such as splashes of dirty water and dust from the ground, or else oil, or grease, or fuel coming from leakages from other parts of the vehicle. In various embodiments the at least one layer for insulation or protection is a solid material, preferably a mouldable or polymerizable material.

In preferred embodiments, the at least one insulation or protection layer that covers the electrodes J comprises a layer of material including silicon (or its derivatives or compounds), i.e., a material that is practically insoluble in water and unattackable by acids. Among such materials of particular interest is, for example, silica, i.e., silicon oxide (silicon dioxide), which can provide an impermeable vitreous layer.

In view of the application proposed herein, preferred precursors for synthesis of silica films or layers are silazanes, and in particular polysilazanes, i.e., polymers the skeleton of which is constituted by silicon atoms bridged by nitrogen atoms. Alternatively, for the application proposed herein, as precursors for the synthesis of silica films or layers other compounds could be used comprising silica ($SiO_2$), preferably in liquid or powder form, possibly in the form of silicon-dioxide or silica powder dispersed in a liquid, in particular in the form designed to be deposited on a PCB and/or coat at least part of the PCB.

The length of the Si—N bond is in general estimated between 1.70 and 1.75 Å, whereas the bond angle depends upon the silicon and nitrogen substituent groups. On account of the polarity of the Si—N bonds and of the basicity of nitrogen, polysilazanes are particularly reactive in regard to hydrolysis in the presence of water (or protic solvents, such as alcohols or acids). These reactions cause breaking of the bond between silicon and nitrogen and quickly lead to formation of silica and ammonia. A particularly promising precursor in this sense is perhydropolysilazane (PHPS), which is constituted by silicon, nitrogen, and hydrogen and the structure of which resembles a three-dimensional lattice, where the silicon atoms are connected together via nitrogen bridges.

Perhydropolysilazane, like other polysilazanes, may be used, together with at least one organic solvent and at least one catalyst, as base for obtaining liquid compositions that can be applied at room temperature on generic non-absorbant surfaces. Following upon application of such a liquid composition, a permanent barrier layer substantially made of vitreous silica is formed, which chemically binds to the substrate at room temperature and polymerises with the humidity present in the air. Compositions of this type are commercially available from various manufacturers and are traditionally used for protecting outer surfaces of means of transport or structures made of wood.

For the purposes of application of the aforesaid composition, the substrate of interest—here the PCB 20—must be previously cleaned, devoid of grease or oily substances, and dry. The application temperature is preferentially comprised between +5° C. and +30° C., with a relative humidity comprised between 30% and 80%. The solution may be applied on the PCB 20 in the form of layer, for example via spraying or else dipping the PCB itself in a container containing the liquid solution, i.e., using a dip-coating technique. Practically complete polymerisation may be obtained at room temperature, usually after approximately 8 to 12 h from application (completion of polymerisation occurs after approximately 7 days at room temperature). Not on the other hand excluded from the scope of the invention is a step of thermal treatment to speed up polymerisation. After polymerisation, the layer applied is transparent, substantially having the appearance of a thin layer of glass.

In addition, and/or as an alternative, the at least one insulation or protection layer that covers the electrodes J may comprise a layer of composite material that includes silicon, or its derivatives or compounds, for example, silicon oxide. A substantially impermeable composite material of this type may have, for example, a matrix having a base of epoxy resin supplemented with glass-fibre fillers.

In various embodiments the at least one insulation or protection layer, which in the condition of use of the device is set between the electrodes J and the peripheral wall 5 of the tank 1, comprises at least two different layers of material, each of which including silicon, or its derivatives or compounds. The aforesaid two layers may be two layers prevalently comprising vitreous silica, obtained starting from a polysilazane-based liquid solution, as referred to above. In other embodiments, the at least one insulation layer comprises a first layer of material including vitreous silica, obtained starting from a polysilazane as referred to above, and a second layer of composite material of the type referred to above, for example including glass fibre. In various preferential embodiments, the aforementioned second layer of composite material is in a position intermediate between the first layer of material and the electrodes J.

In other embodiments still, the at least one insulation layer comprises at least two different layers of material, of which a first insulation layer includes silicon, or its derivatives or compounds, and the other insulation layer—on which there may possibly be mounted the casing 30 or overmoulded the material of the casing 30, if envisaged—is made of a polymer that is less stiff, i.e., more flexible, than the material of the first layer, for example a substantially impermeable polymer containing fluorine derivatives or compounds.

In various embodiments, the at least one insulation or protection layer comprises at least one material or polymer that is at least in part flexible, or deformable, or compressible, such as a fluoropolymer or an elastomer, on which there may possibly be mounted the casing 30 or overmoulded the material of the casing 30, if envisaged, where preferably the casing 30 is made of a polymer that is stiffer than the material of the aforementioned insulation layer.

The electrodes J may also be covered with at least one insulation layer made of an electrically insulating and substantially impermeable material that does not include silicon or its compounds. In particularly advantageous embodiments, this material is a polymer containing fluorine or its derivatives or compounds, as described hereinafter. In other embodiments, the material without silicon of the at least one insulation layer is a layer that comprises an epoxy-based material, such as a layer of the type known as "solder-resist", i.e., a thin layer of polymeric material designed to provide a protection against oxidation, in particular an epoxy-based material. In the case where the material constituting the solder-resist or epoxy-based layer is similar to a paint or an ink, possibly of a photosensitive type, it can be sprayed on or applied using silk-screen printing techniques or the like; on the other hand, the solder-resist or epoxy-based layer may also be made in the form of a film applied using a vacuum lamination method.

In the case exemplified in FIGS. 2-3, and in the corresponding FIGS. 4-7, the electrodes J are covered and insulated via:

i) a first layer of composite material;
ii) a second layer of a material that is here assumed to be of a solder-resist or epoxy-based type; and
iii) a third, silica-based, layer.

In the case exemplified, the first layer of composite material has an epoxy-resin-based matrix that is filled with glass fibre. Very advantageously, the aforesaid first composite material may be constituted by one of the layers of the multilayer structure itself of the PCB 20. With reference also to FIGS. 4-7, in the non-limiting example illustrated, the supporting structure of the PCB 20 includes at least one supporting layer $20_1$, on an outer face of which the corresponding electrodes J are arranged.

Preferentially, but not necessarily, the supporting structure of the PCB 20 may comprise one or more further layers $20_2$ in a position corresponding to the face of the layer $20_1$ opposite to the one that carries the electrodes J. The layer $20_1$ that carries the electrodes J is in turn coated with an outer layer $20_3$ of the multilayer structure itself so that the electrodes J will be coated accordingly.

In the attached figures, merely for purposes of description, also layers in positions that are homologous with respect to the centre of the multilayer structure exemplified (i.e., in a position opposite to the layers $20_1$ and $20_3$ between which the electrodes J are located) are designated by $20_1$ and $20_3$, and some possible layers set in between are designated by $20_2$. It is, however, clear that, for the purposes of practical implementation, even just a single layer $20_1$ that carries the electrodes J and a single layer $20_3$ that covers the single layer $20_1$ may be sufficient. In the example represented, then, the outer layers designated by $20_3$ form the opposite major sides (20a, FIG. 8) of the PCB 20, but as has been said, the aforesaid opposite major sides could also be formed by a single layer $20_3$, on one side, and by a single layer $20_1$, on the other.

The various layers $20_1$, $20_2$, and $20_3$ of the PCB 20 are preferably made of the same material, for example FR4 or the like, even though this does not constitute an essential characteristic.

Once again with reference to the non-limiting example illustrated in FIGS. 2-7, on at least one of the outer layers $20_3$ of the multilayer structure of the PCB 20 there are respective second layers 40, which are here assumed as being of a solder-resist or epoxy-based type, designated by 40. It will be appreciated that, since the electrodes J are arranged within the supporting structure of the PCB 20, the main function of the layers 40, when these are of a solder-resist or epoxy-based type, is to counter possible oxidative phenomena, and/or phenomena of infiltration of humidity, and/or vapours, and/or liquids, and/or dust, rather than preventing possible short-circuits.

In the example represented, the layers 40 coat only the outer face of the layers $20_3$ of the PCB 20, preferably completely, but in other embodiments the layers 40 may belong to a single coating that surrounds the PCB 20, or at least one portion thereof at its major sides and its lateral edges or minor sides (as for the layer or coating 50 described hereinafter). In other embodiments, just one layer 40 may be provided, which covers the layer $20_3$, located under which are the electrodes J.

Finally, present on the PCB 20, i.e., on each of the layers 40, is the third layer substantially made of silica, designated by 50. The third layer 50, or each third layer 50, may be applied as an individual layer that coats a respective layer 40 or else, as in the case exemplified, may itself be applied as a coating that surrounds the PCB 20 on a number of sides and edges. For this reason, in what follows, the layer 50 will also be identified as "outer coating". Also the outer coating or layer 50 may surround or coat the entire PCB 20 or only a part of interest thereof. In other embodiments, just one layer 50 may be provided on a single layer 40, which in turn covers the layer $20_3$, located under which are the electrodes J.

By way of indication, the layers $20_3$ of composite material may have a thickness of between 0.2 mm and 0.4 mm, the layers 40 may have a thickness of between 10 μm and 30 μm, and the outer coating 50 (or at least its layer coating the major sides of the PCB 20 where the electrodes J are located) may have a thickness of between 10 μm and 30 μm. The outer casing 30 may have a thickness of between 1 mm and 2.4 mm, preferably of between 1.4 mm and 1.8 mm, very preferably between 1.5 and 1.6 mm.

The layers made of composite material $20_3$ are formed during production of the PCB 20 itself, themselves constituting part of its multilayer structure. As has been said, the multilayer structure of the PCB 20 may be obtained using materials such as FR4, or vetronite or similar electrically insulating composite materials, of a GRP (Glass-Reinforced Plastic) type. The preferred composites used are epoxy-based, such as an epoxy resin with glass fibre. The various layers of the structure of the PCB are preferably laminated on one another, according to a technique in themselves known in the sector of the manufacture of multilayer PCBs.

The layers 40 may be sprayed on the outer face of the layers $20_3$ but there is nothing in principle to rule out application of the epoxy material of the layers 40 in another way, for example via overmoulding.

Also the solution based on polysilazanes or silicon dioxide, which is to be converted prevalently into silica, i.e., to provide a vitreous insulation coating 50, may be deposited or applied using spray-coating techniques, or else may be applied by dipping the PCB totally or partially in a container containing the liquid solution, i.e., using dip-coating techniques. Deposition may, on the other hand, be carried out using other known techniques, such as spin-coating (deposition by rotation of the PCB), flow-coating (deposition via a flow that impinges upon the PCB), CVD (Chemical Vapour Deposition), PVD (Physical Vapour Deposition), etc. These techniques may also be used for deposition of the layers 40.

Figure 7:
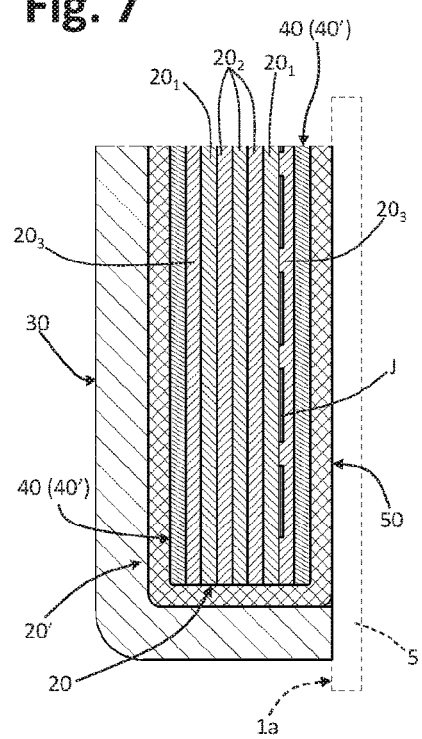

As may be seen, according to an inventive aspect, the level-sensor device 10 may comprise at least three insulation elements or layers (30, 50, 40, $20_3$) that separate the electrodes J, i.e., the structure ($20_1$, $20_2$) that supports them, from the external environment and/or from the peripheral wall 5 of the tank 1 containing the liquid undergoing detection: see FIGS. 6-7.

Exemplified in FIGS. 9-12 is a possible sequence for producing the casing body of a device according to possible embodiments of the invention. Illustrated in FIG. 9 is the semi-finished product—including the PCB 20, the layers 40, and the outer coating or layers 50—designated as a whole by 20'. It is to be assumed that the aforesaid semi-finished product 20' (hereinafter also defined as "coated PCB 20") is already provided, not only with the electrodes J, but also with the remaining part of the detection and/or processing circuitry. Applied to the semi-finished product 20' is the body part 21, for example shaped like a shell defining a cavity designed to receive at least partially the regions 25 and 26 of the PCB 20 (FIG. 8), i.e., of the semi-finished product 20'. As has been said, preferentially the part 21 integrates the connector body 15a and the terminals 17, with the latter that in this stage are electrically connected to corresponding conductive paths of the PCB 20.

Next (see FIG. 10), applied to the semi-finished product 20' is the body part 22, with at least one portion of the control region 25 (FIG. 8) of the PCB 20, i.e., of the semi-finished product 20', set in between. The body part 22 may be configured as a distinct component, for example in the form of a lid fixed to the body part 21 (for instance, fixed via snap action, or via threaded means, or welded, or glued), or else may be itself configured as an overmoulded or resin-laminated part. The two parts 21 and 22, in particular when they are constituted by distinct components, may be provided with means for mutual coupling, such as pins and seats of the part 21 designed to couple with corresponding seats and pins of the part 22.

Preferentially, the body parts 21 and 22 are made of a polymer having a melting point higher than 260° C. or in any case designed to resist this temperature in particular in order to be able to withstand possible overmoulding of at least one polymer at a temperature lower than 250° C., for example a polymer designed to provide the outer casing 30 of the casing body of the device 10. For this purpose, in various embodiments, the material for the body parts 21 and 22 is selected from polyphthalamide (PPA), polyamide copolymers (PA66), and polyphenylene sulphide (PPS).

Possibly, in an area corresponding to the cavity of the body part 21, and of the corresponding portions of the semi-finished product 20', i.e., of the PCB 20, that are housed in this cavity, there may be applied a resin aimed at improving the characteristics of protection of the electrical and/or electronic components that are located in these regions. The resin or similar material used is preferably of the type with low melting point or polymerisation temperature, in particular a temperature of transformation such as not to damage the electrical and/or electronic components (such as a temperature of between 180° C. and 240° C., preferably close to 200° C.). A thermoplastic material suitable for the purpose, which is preferably relatively elastic or not stiff, may be of the so-called hot-melt or hot-glue type.

Next, if so required, at least the portion of the PCB 20, i.e., of the semi-finished product 20', that includes the detection region 24 is inserted in a mould for overmoulding the polymeric material that is to provide the outer casing 30. The material used for overmoulding of the casing 30 may be a thermoplastic material or else a thermosetting material. Preferred materials are high-density polyethylene (HDPE), polypropylene (PP), polyphthalamide (PPA), and polyphenylene sulphide (PPS). As has been said, on the other hand, in other embodiments, the outer casing 30 may be configured as a component produced separately and then applied on the semi-finished product 20'.

Preferentially, the mould is configured for receiving also at least part of the intermediate region 26, provided with the body parts 21 and 22. In this case, in the course of the overmoulding operation, the circuit components possibly present in the intermediate region 26 of the PCB 20, i.e., of the semi-finished product 20', albeit located within the overmoulding area, are in any case protected, in view of the fact that this intermediate region is enclosed between the body parts 21 and 22; the protection is further increased in the presence of the aforesaid resin.

The result of the operation of overmoulding (or of separate application) of the outer casing 30 is exemplified in FIG. 11, where the casing body of the device is now formed: as may be noted, the casing 30 does not enclose the semi-finished product 20' completely, leaving exposed at least the face thereof that is to face or be set up against the peripheral wall 5 of the tank 1 of FIG. 1.

In FIGS. 11 and 12, it may be noted how the outer casing 30 may advantageously be formed so as to define brackets or the like 16, such as elements in relief or projecting from the casing 30, useful for fixing the device 10 to the peripheral wall 5 of the tank 1 represented in FIG. 1, for example via threaded members or other engagement means. It is on the other hand possible to envisage for the purpose brackets or similar fixing means configured as components distinct from the body of the device 10.

In addition or as an alternative to brackets or the like, fixing of the sensor device 10 to the peripheral wall 5 can be carried out using a layer of bonding agent that is deposited on the face of the device (and hence of the PCB 20) that is to be set up against the tank 1. Such a layer of bonding agent is designated by G in FIG. 12.

Irrespective of the modalities of fixing, which as has been said may be different, in various preferred embodiments the device 10 rests against the side wall 5 of the tank 1, for example in contact with the latter, preferably in such a way as to prevent substantially any presence of air gaps between the face of the device 10, located in a position corresponding to which are the electrodes J, and the outside of the wall 5 (as already mentioned, it is possible to interpose a layer of a bonding agent, or else of a gel, designed to fill microcavities possibly caused by surface roughness). Possibly, the device 10 may be fixed relative to the side wall 5 in a condition of slight elastic pressure against the wall itself so as to improve contact between the parts and reduce the presence of air gaps.

Embodiments of the sort represented in FIGS. 2-7 are particularly advantageous in so far as they prevent the aforesaid external agents, as well as the humidity possibly absorbed by the wall 5 following upon its prolonged contact with the liquid undergoing detection, from possibly reaching the electrodes J, or at least they considerably delay such agents in reaching the electrodes J.

In various embodiments, the layer or layers 40 are omitted. An example in this sense is illustrated in FIGS. 13-16, where provided between the electrodes J of the respective array and the external environment (including, for example, the peripheral wall 5 of the tank) are two layers containing silicon or its derivatives or compounds, here represented by a layer $20_3$ of the PCB 20 and by an outer coating 50. In embodiments of the type illustrated in FIGS. 13-16, in any case, set between the external environment and the electrodes J are two layers of different materials (50 and $20_3$). Insulation of the electrodes J from the aforesaid external agents, including humidity or liquid that could possibly impregnate the wall 5, albeit reduced as compared to embodiments of the type exemplified in FIGS. 2-6, remains in any case high and more than sufficient for various applications of the device.

Figure 15:
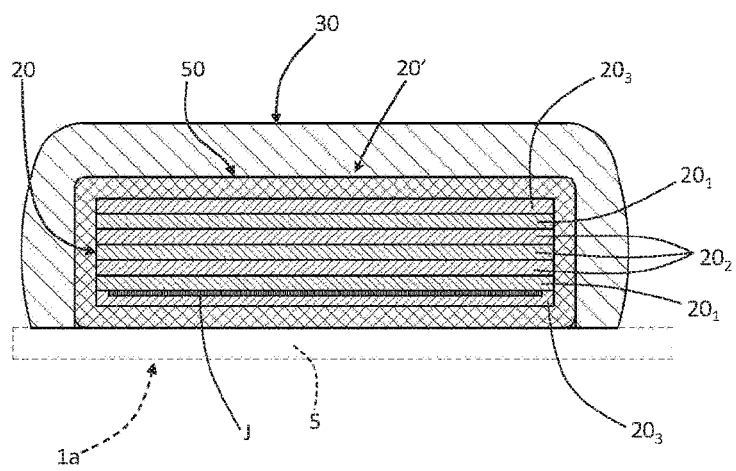
FIGS. 15 and 16 are schematic cross-sectional views according to the lines XV-XV and XVI-XVI, respectively, of FIG. 14.
Figure 16:
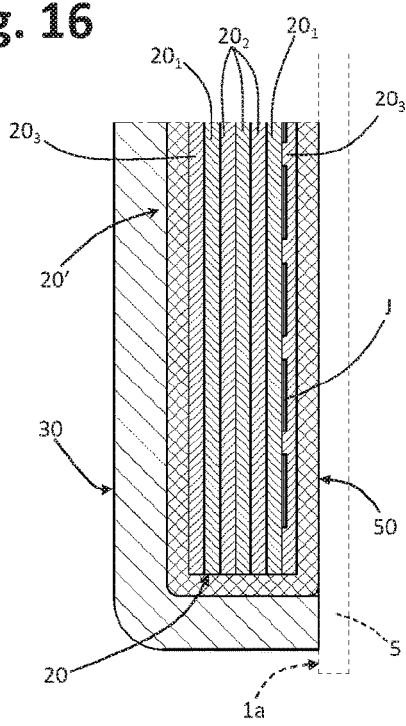

As may be seen, according to an inventive aspect, the level-sensor device 10 comprises at least two insulation elements or layers (30, 50, 40) that separate the electrodes J, i.e., the structure ($20_1$, $20_2$) that supports them, from the external environment, and also from the peripheral wall 5 of the tank 1 containing the liquid undergoing detection: see, in this connection, FIGS. 15 and 16.

In various embodiments, the electrodes J are not arranged within the structure of the PCB 20, but arranged at a respective outer face of said structure. An example in this sense is illustrated in FIGS. 17-20. In the example illustrated in these figures the outer layers $20_3$ of the PCB 20 are hence not present, with the electrodes J that directly give out onto the outside of the PCB itself, at a major side thereof (here represented by a layer $20_1$ that carries the electrodes). It will be appreciated that, in embodiments of this sort, the PCB 20 does not necessarily have a multilayer structure. In the case of FIGS. 17-20, the layers 40, for example of a solder-resist or epoxy type, are present, applied directly on the layers $20_1$ of the PCB 20 so as to cover also the electrodes J. In embodiments of the type in which the material necessary for formation of the layers 40 is in the form of paint or ink, this material may, if necessary, be applied—for example, via silk-screen deposition—in such a way that the outer surface of the layers 40 is substantially plane, as in the case illustrated (i.e., the corresponding material will be deposited in such a way that the thickness of the layers 40 is smaller in the area of the electrodes J). This does not, however, constitute an essential characteristic for the purposes of operation of the device.

Also in embodiments of the type illustrated in FIGS. 17-20, in any case, set between the external environment and the electrodes J are two further layers of different materials (40 and 50), and this enables effective protection of the detection region of the device 10 in various applications.

Figure 19:
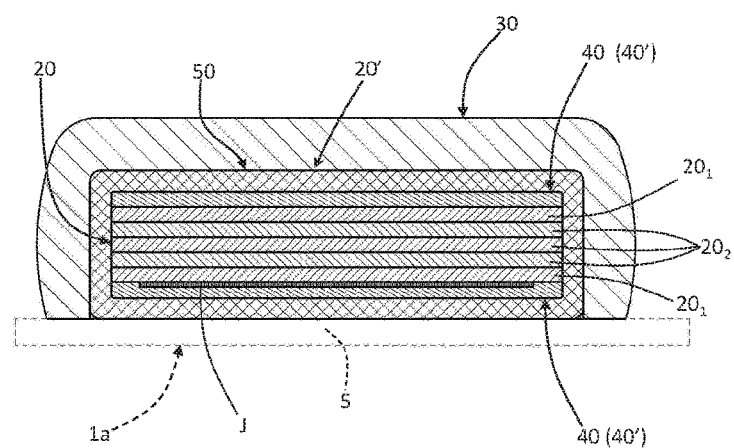
FIGS. 19 and 20 are schematic cross-sectional views according to the lines XIX-XIX and XX-XX, respectively, of FIG. 18.
Figure 20:
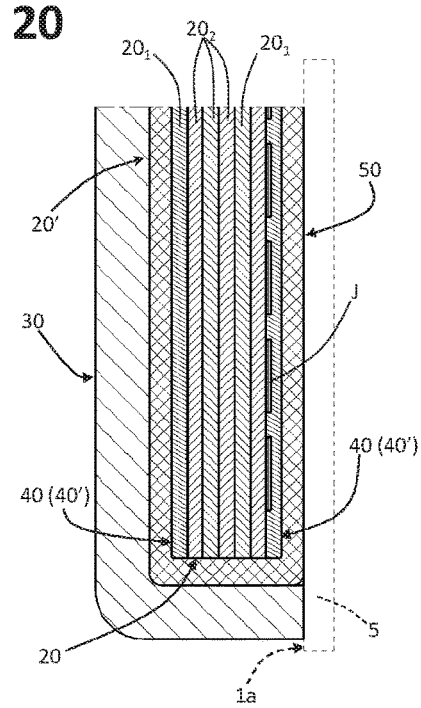

Also in this case, according to an inventive aspect, the level-sensor device 10 comprises at least two insulation elements or layers (30, 50, 40) that separate the electrodes J, i.e., the structure ($20_1$, $20_2$) that supports them, from the external environment, and also from the peripheral wall 5 of the tank 1 containing the liquid undergoing detection: see, in this connection, FIGS. 19 and 20.

In various embodiments, the outer coating or the layers 50 are omitted. An example in this sense is illustrated in FIGS. 21-24, according to which between the electrodes J of the respective array and the wall 5 two layers of different materials, here represented by a layer $20_3$ of the PCB 20 and a layer 40, for example of a solder-resist or epoxy-based type, are in any case provided. Hence, also in this case, set between the external environment and the electrodes J are, in addition to the possible coating 30, at least two layers of different materials (layers 40 and $20_3$), which prevents the aforesaid external agents from reaching the electrodes or in any case delays them.

Figure 23:
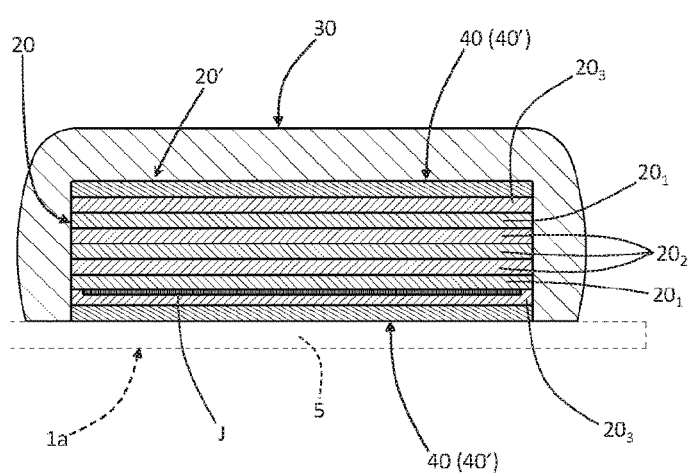
FIGS. 23 and 24 are schematic cross-sectional views according to the lines XXIII-XXIII and XXIV-XXIV, respectively, of FIG. 22.
Figure 24:
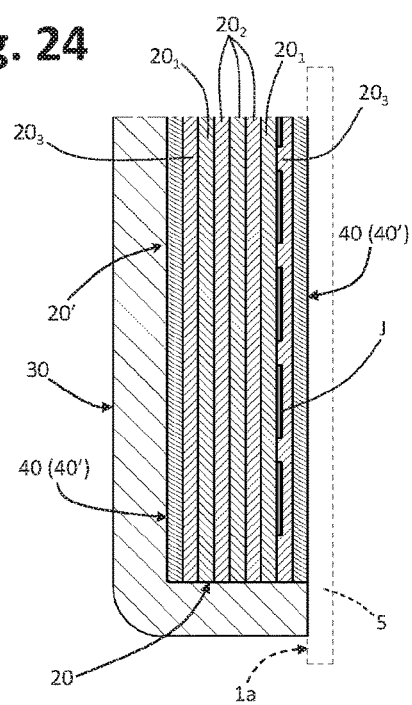
Figure 27:
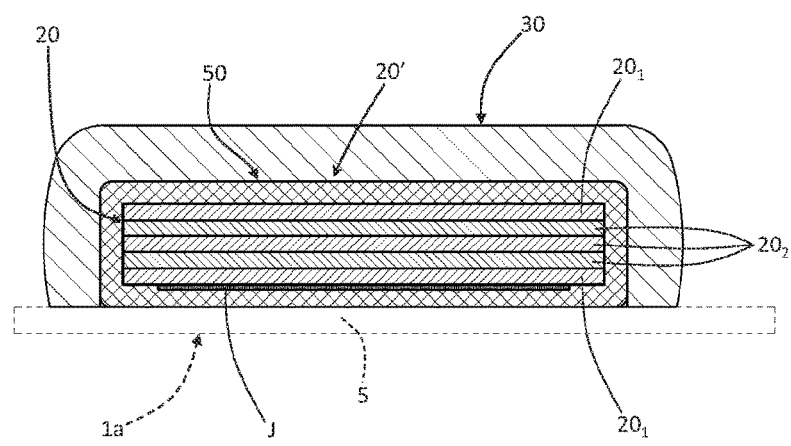
FIGS. 27 and 28 are schematic cross-sectional views according to the lines XXVII-XXVII and XXVIII-XXVIII, respectively, of FIG. 26.
Figure 28:
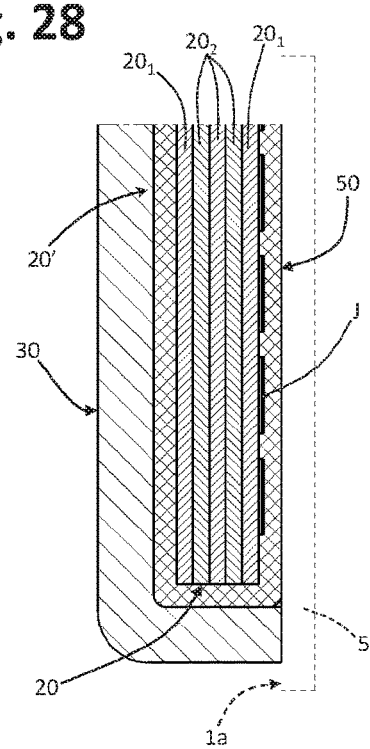
Figure 29:
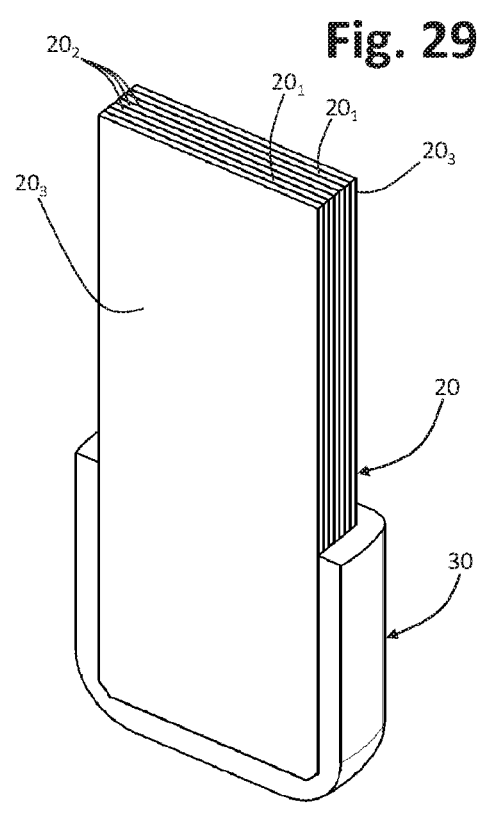
FIGS. 29 and 30 are schematic views similar to those of FIGS. 4 and 5, regarding a level-sensor device according to further possible embodiments of the invention.
Figure 30:
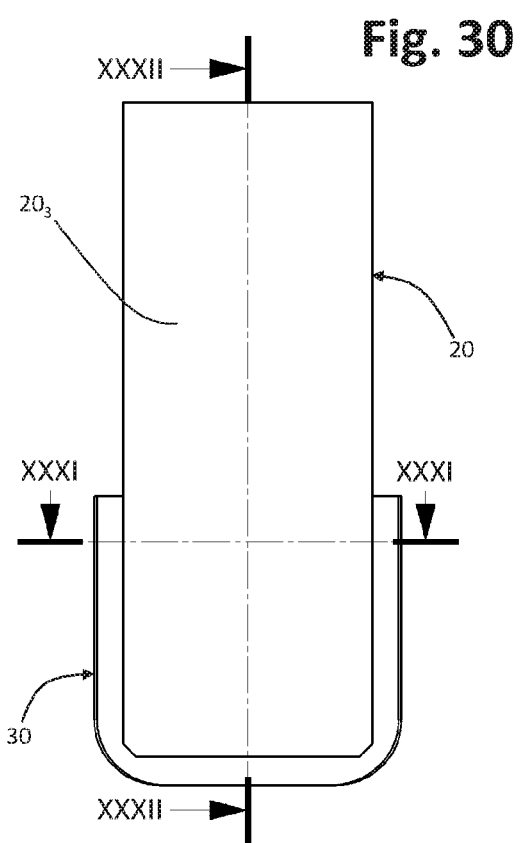
Figure 31:
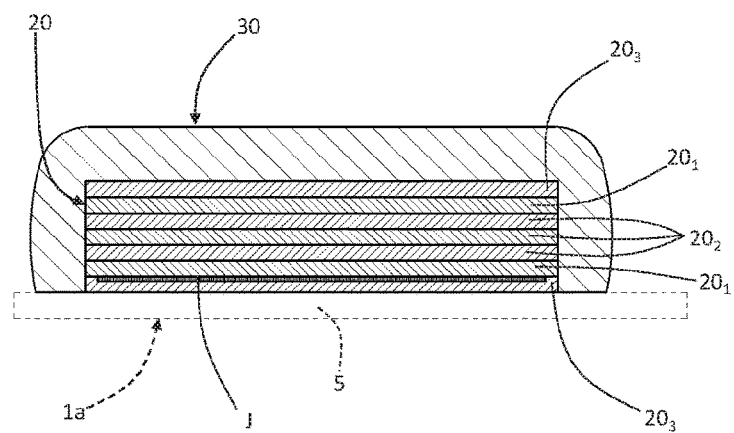
FIGS. 31 and 32 are schematic cross-sectional views according to the lines XXXI-XXXI and XXXII-XXXII, respectively, of FIG. 30.
Figure 32:
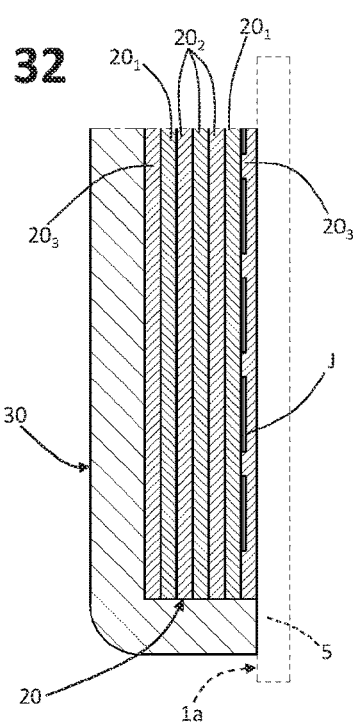
Figure 35:
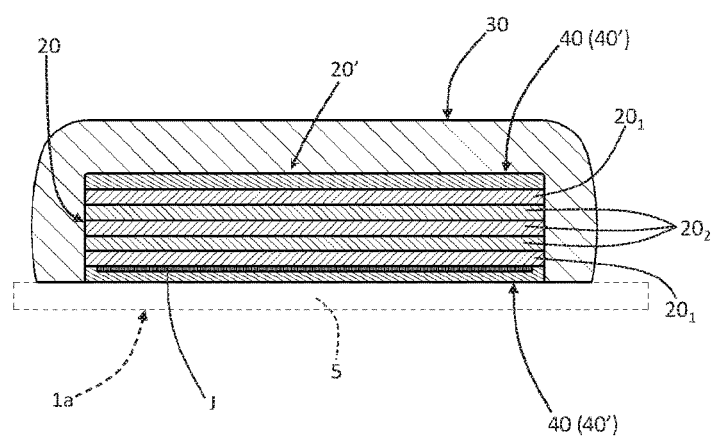
FIGS. 35 and 36 are schematic cross-sectional views according to the lines XXXV-XXXV and XXXVI-XXXVI, respectively, of FIG. 34.
Figure 36:
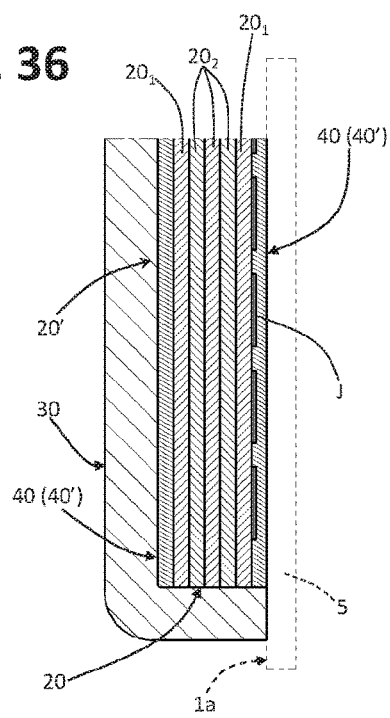
Figure 39:
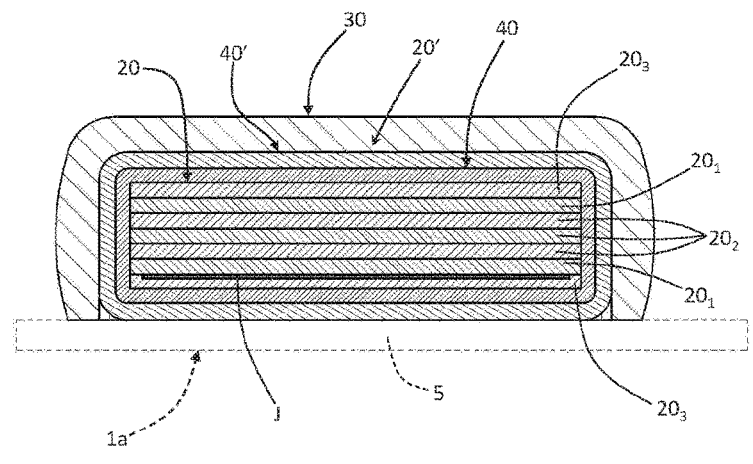
FIGS. 39 and 40 are schematic cross-sectional views according to the lines XXXIX-XXXIX and XL-XL, respectively, of FIG. 38.
Figure 40:
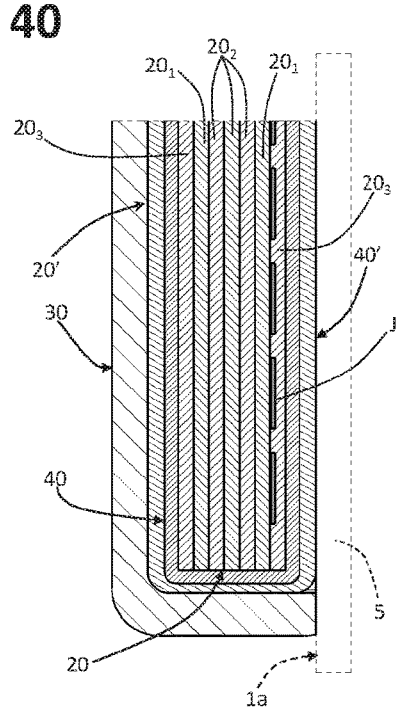

Hence, also in this case, the level-sensor device 10 comprises at least two insulation elements or layers (30, 40, $20_3$) that separate the electrodes J, i.e., the structure $20_1$, $20_2$ that supports them, from the external environment, and also from the peripheral wall 5 of the tank 1 containing the liquid undergoing detection: see, in this connection, FIGS. 23 and 24.

FIGS. 25-28 exemplify further possible embodiments, where the layers 40 are omitted and the electrodes J are not arranged within the structure of the PCB 20, but in a position corresponding to a respective outer face of this structure. Hence, also in this case, the outer layers $20_3$ of the PCB 20 are absent, with the electrodes J that directly give out on the outside of the PCB, in a position corresponding to one of its two major sides (also here represented by a layer $20_1$ that carries the electrodes). The outer coating or the layers 50 are thus applied directly on the layers $20_1$ of the PCB 20 so as to cover also the electrodes J. It will be appreciated that, also in embodiments of this type, the PCB 20 does not necessarily have a multilayer structure. In embodiments of the type illustrated in FIGS. 25-28 set between the external environment and the electrodes J is, in addition to the possible casing 30, at least the silica-based outer coating or layer 50, as may be clearly noted in FIGS. 27-28.

The insulation from the external agents thus obtained, albeit reduced as compared to other embodiments described previously, is in any case sufficient for various applications of the device, in particular when the material used for providing of the insulation layer 50 is a vitreous or silica-based layer that uniformly coats the PCB 20, without leaving any passages or porosities, and hence with good sealing characteristics, even though it has a small thickness.

FIGS. 29-32 exemplify further possible embodiments, where both the layers 40 and the outer coating or layers 50 are omitted, with the electrodes J that are arranged within the multilayer structure of the PCB 20, underneath an outer layer $20_3$. Hence, also in embodiments of this type, set between the external environment and the electrodes J is, in addition to the possible casing 30, just one layer $20_3$ belonging to the multilayer structure of the PCB 20. Also structures of this type are sufficient for protection or at least for delaying the negative effects of possible foreign agents of the type exemplified previously.

Likewise, FIGS. 33-36 exemplify further possible embodiments, where the outer coating or layers 50 are omitted, and the electrodes J are not arranged within the structure of the PCB 20, but in a position corresponding to a respective outer face of the structure. Hence, also in this case, no outer layer $20_3$ of the PCB 20 is present, but laid on the layer $20_1$ that carries the electrodes J (and here also on the opposite layer $20_1$) is a respective layer 40, for example of a solder-resist or epoxy-based type, so as to cover the electrodes themselves. It will be appreciated that, also in embodiments of this type, the PCB 20 does not necessarily have a multilayer structure. In embodiments of this type, set between the liquid undergoing level detection and the electrodes J is, in addition to the wall 5 of the tank, just the layer 40, which is in any case sufficient in various applications.

Provision of an outer coating or layers 50 prevalently made of silica obtained starting from a polysilazane-based composition is particularly advantageous also because, during the corresponding polymerisation, the silicon binds to the —OH group of the corresponding substrate 20, and/or 40. In this way a bond tendentially of a secondary type is obtained between the outer coating 50 and the underlying substrate (which, according to the cases, is constituted by a layer 40 or a layer $20_3$) which contributes to improving fixing between the materials and hence the strength of the structure. In this perspective, as mentioned previously, in various embodiments, the PCB 20 and/or the layers 40 are preferentially formed using an epoxy-based material, i.e., one comprising an —OH group, thereby guaranteeing a chemical bond with the outer coating 50 and/or the layers 40. Once again in this perspective, the electrodes J are preferably made of a metal or metal alloys (for example, copper or copper-based alloys). Given that in the production stage on the aforesaid metal there occur in any case pseudo-oxidation processes with grafting of —OH functional groups, also in the cases where the polysilazane-based or silicon-dioxide-based solution is applied partially in contact with the electrodes J, basic chemical bonds (—OH or else O* functional groups) form between the metal and the polysilazanes or silicon dioxide, with consequent advantages in terms of fixing between the different materials.

In various particularly advantageous embodiments, the epoxy-based layers designated previously by 40 may be substituted by layers 40' made of a polymer containing precursors, or derivatives, or compounds of fluorine such as a fluorinated polymer or fluoropolymer or perfluorinated polymer, preferably without perfluorooctane sulphonate (PFOS) and perfluorooctanoic acid (PFOA). For this reason, in various ones of the figures mentioned above, associated to the reference number 40 is also the reference number 40' in brackets. Preferred materials are, for example, fluorinated ethylene propylene (FEP), polytetrafluorine ethylene (PTFE) and, more in general, fluorine-acrylate-based polymers. The configurations described previously, where the layers 40 are envisaged are hence to be understood as valid in the case where these layers are substituted by layers 40' made of a polymer containing precursors or derivatives or composites of fluorine. Also the layers 40' may belong to an (intermediate or outer) insulation coating that surrounds the PCB 20, i.e., that extends also at the edges or minor sides of the PCB (as illustrated, for example, in FIGS. 37-46). The layers or coatings 40' may have a thickness of between 10 μm and 70 μm.

The studies conducted by the present Applicant have made it possible to ascertain that fluorine-based polymeric materials, or derivatives or compounds of fluorine (such as completely or partially fluorinated fluoropolymers), are particularly advantageous for the purposes of the application proposed herein. Fluorates, in addition to being chemically very resistant, present an excellent resistance also at high temperatures, and are thus perfectly suitable for withstanding the possible overmoulding of the outer casing 30. These materials are moreover relatively flexible, or not stiff, and relatively deformable or compressible, and are hence able to withstand very well thermal expansion and thermal shock, likewise presenting very low coefficients of friction, with a consequent possibility of withstanding the relative movements that, on account of different coefficients of thermal expansion, may occur between the material of the casing 30 and the PCB 20 (and/or possible other layers, such as the layers 40 and/or 50).

Practical permeation tests conducted by the present Applicant have also made it possible to ascertain that fluorinated polymers enable excellent results to be obtained in terms of resistance to water-urea solutions, such as AdBlue, this also by virtue of the very low surface energy of the fluorinated polymers, which are highly hydrophobic. This characteristic is particularly advantageous in the case where the liquid of which the level is be detected is water or a water-based solution (such as AdBlue, which prevalently consists of water) in the case where this liquid impregnates the wall 5 for a long period, or else may accidentally come into contact with the device 10 during topping-up of the tank 1.

The presence of an insulation layer 40' made of fluorinated polymer moreover enables good protection against chemical aggression of the electrodes, and/or of the PCB 20, in the case of any infiltration of aggressive liquids, such as water-urea solutions. The presence of an insulation layer 40' made of fluorinated polymer enables protection of the electrodes J from the external environment, for example from a solution with water and salt that could be present on the road in winter periods, which could reach at least part of the device 10.

The use of fluoropolymers for producing layers or coatings 40' is particularly advantageous also in view of the fact that, in various configurations, during polymerisation of the material, it is possible to obtain chemical and/or structural bonds with the materials of the corresponding substrate. This is particularly advantageous when the PCB 20 and/or the layers 40 are made of epoxy-based materials. In this perspective, as already mentioned, the material for the PCB 20 is preferentially epoxy-based (for example FR4, the matrix of which is in general constituted by an epoxy resin), and the layers 40 of a solder-resist type are also made of an epoxy resin.

For instance, illustrated in FIGS. 37-40 is the case where the electrodes J are covered and protected by:
  i) a first layer of composite material $20_3$;
  ii) a second layer of material 40; and
  iii) a third layer 40' with a fluorinated-polymer base;

According to embodiments (not illustrated), the layer of composite material $20_3$ may be omitted.

In the case exemplified in the figure, the possible first layer of composite material is constituted by an outer layer $20_3$ of the multilayer structure of the PCB so that the electrodes J are coated accordingly, whereas the layer 40 belongs to an insulation coating of a solder-resist or epoxy-based type, which coats the structure of the PCB 20 at its major sides and its edges or minor sides. The third layer 40' belongs, instead, to a further fluorinated-polymer insulation coating, for example made of FEP, which surrounds the epoxy-based coating to which the layers 40 belong. The material of the outer casing 30 is then possibly overmoulded on the coating to which the layers 40' belong.

In solutions of the type exemplified in FIGS. 37-40, provided between the layers or coating 40' and the layers or coating 40 is a hydrogen bond between the —OH group of the epoxy-based substrate, here represented by the layers or coating 40, with the more electronegative atoms of the fluorine of the fluorinated polymer, for example the FEP, that provides the layers or coating 40'. The hydrogen bond or hydrogen bridge is a particular case of intermolecular force implicated in which is a hydrogen atom involved in a covalent bond with very electronegative elements (such as fluorine, oxygen, or nitrogen), which attract to themselves the valence electrons, acquiring a partial negative charge (δ−), leaving the hydrogen with a partial positive charge (δ+). Simultaneously, the hydrogen is attracted by an electronegative atom of a nearby molecule.

Figure 41:
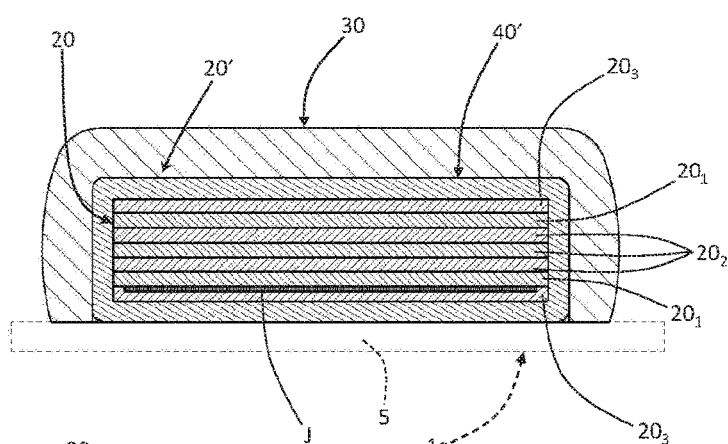
FIGS. 41 and 42 are schematic cross-sectional views similar to those of FIG. 39, regarding level-sensor devices according to further possible embodiments of the invention.
Figure 42:
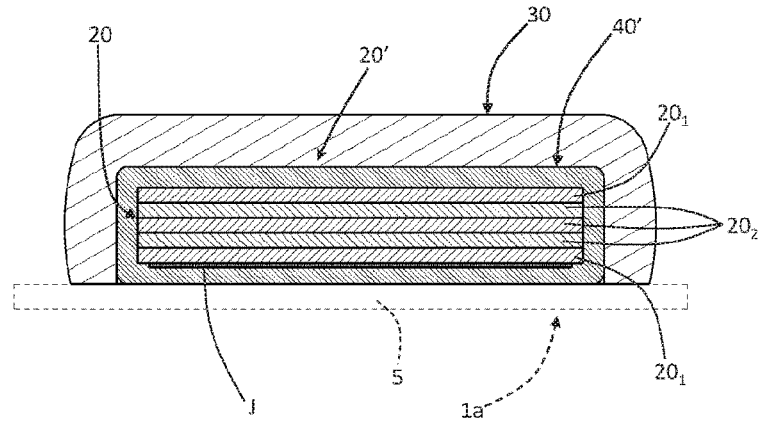
Figure 45:
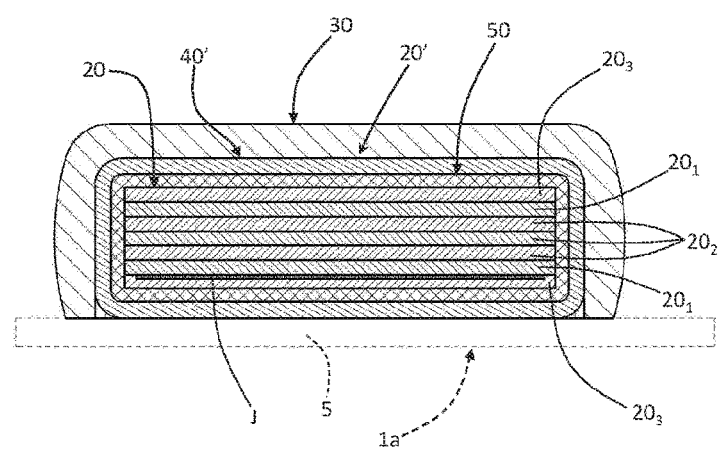
FIGS. 45 and 46 are schematic cross-sectional views according to the lines XLV-XLV and XLVI-XLVI, respectively, of FIG. 44.
Figure 46:
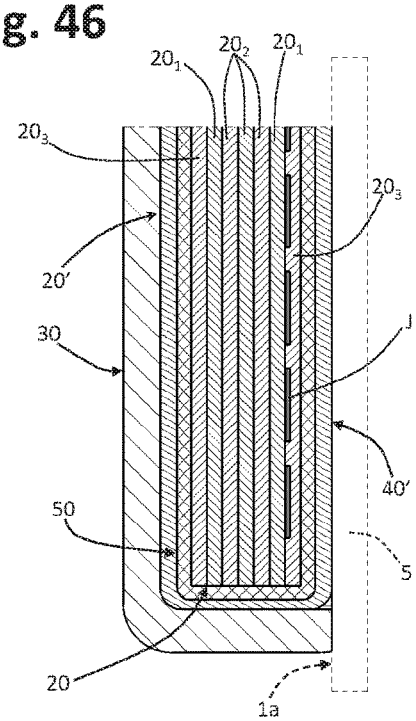

It will thus be appreciated that the aforesaid bond contributes to improving fixing between the materials, and hence to the strength of the structure. Bonds similar to the ones just exemplified are formed when layers or coatings of the type designated by 40' are applied directly on a PCB 20 made at least in part of an epoxy resin. Cases of this type are exemplified in FIGS. 41 and 42. FIG. 41 regards the case of a coating 40' that coats a multilayer PCB 20, where the electrodes J are already covered with a layer made of composite $20_3$, whereas FIG. 42 regards the case of a PCB with electrodes J exposed (i.e., on the outer faces of the layers $20_1$).

According to one aspect, the present invention proposes elimination or at least reduction of possible mechanical stresses to which internal elements of the level-sensor device may be subjected, such as the PCB 20, and/or circuit components carried by the PCB, and/or intermediate layers of material between the PCB and the outer casing 30, due for example to shrinkage of the overmoulding material of the aforesaid casing 30, and/or following upon dimensional variations due to thermal jumps or shocks (for example, following upon heating of the frozen liquid, and/or variations of the ambient temperature).

For this reason, in embodiments in themselves inventive, and as already mentioned previously, at least one insulation layer of the device performs functions of mechanical compensation and comprises for this purpose a material or polymer that is at least in part flexible, or deformable, or compressible, on which there is to be applied the casing 30 or else overmoulded the material that provides the casing 30, where preferably the casing 30 is made of a polymer that is stiffer than the material of the aforementioned insulating layer that performs functions of compensation.

For instance, as mentioned previously, fluoropolymers are relatively flexible, and/or deformable, and distinguished by low surface friction so that the corresponding layers can advantageously perform functions of mechanical compensation, for instance, in order to absorb possible mechanical stresses determined by the casing 30 with respect to an underlying substrate, such as the PCB 20 or the coating 40. As has been said, these mechanical stresses may be due to shrinkage of the outer casing 30 and/or to stresses on the sensor device, following upon thermal shock that induces dimensional variations of parts of the device.

In other embodiments, the aforementioned functions of compensation of the aforesaid possible stresses may be obtained by means of one or more layers 40' made of relatively elastic, and/or compressible, and/or deformable elastomers or polymers different from the ones referred to previously, even ones not containing fluorine derivatives or compounds.

In particularly advantageous embodiments of the invention, it is also possible to combine an insulation layer or coating of the type designated previously by 50, which is relatively more rigid and brittle and hence potentially subject to the risk of cracking following upon mechanical stresses or strains, with a fluorinated layer or coating that coats the first layer 50, for example so as to prevent excessive thrust, and/or shrinkage, and/or deformations of the outer casing 30 that might induce stresses on or cracks in the layer 50.

In the case of an outer casing 30 mounted on the layer 50, excessive mechanical tensile or compressive stresses could arise in the assembly stage, for example on account of erroneous positioning or dimensional tolerances in manufacture of the various components, whereas in the case of an overmoulded outer casing 30 stresses could arise following upon shrinkage or excessive strains in the production stage. In both cases, further stresses or strains could in any case arise following upon dimensional settling of the materials or on account of expansion and/or contraction following upon variations in ambient temperature, or else stresses or strains following upon vibrations during movement of the vehicle or following upon external mechanical stresses, such as a dimensional variation of the wall of the tank following upon filling of the tank or heating and/or cooling of the liquid contained therein, which could even freeze and expand in the direction of the sensor device 10.

Such a case is exemplified in FIGS. 43-46, where applied to a multilayer PCB 20 is an insulation coating 50 made of silica or silicon oxide, of the type described previously, on which an insulation coating 40', made of a fluoropolymer, is in turn applied. It will be appreciated that solutions of this sort enable maximisation of insulation of the electrodes J in regard to external agents, as emerges from FIGS. 45-46.

It should moreover be emphasised that the higher flexibility (or yielding, or compressibility, or deformability) of an insulation coating made of a fluoropolymer as compared to corresponding substrates of a vitreous type (50), or composite type (20), or epoxy type (20, 40) protects the latter from mechanical stresses or strains, as exemplified above.

In general, the functions of mechanical compensation described above with reference to FIGS. 37-42 hence also apply in the case exemplified in FIGS. 43-46, in particular in order to safeguard the integrity of the vitreous coating 50.

Reference has been made previously to a sensor device 10 the body of which includes an outer casing 30, which encloses at least partially the detection region 24 of a circuit support 20, located in which are the detection electrodes J. As already mentioned, the presence of the aforesaid outer casing 30—which may be of an overmoulded type or else produced separately and then coupled to the circuit support—is to be considered merely optional, albeit preferable for the purposes of protection of the device.

FIG. 47 illustrates partially a tank 1 provided with a level-sensor device 10, the detection part 11 of which is without the outer casing 30. Also in embodiments of this type, the device 10 is prearranged for being fixed on the outside of the body 1a of the tank 1, in particular on an electrically non-conductive lateral or peripheral wall 5 thereof so as to extend along the level-detection axis X, and with the side of the device where the electrodes J are located that faces the outer surface of the aforesaid wall 5, preferentially resting against or in contact with the latter.

The device 10 of FIG. 47 may be obtained according to any of the embodiments described previously, with the sole substantial difference that, as has been said, the outer casing 30 is not provided. An example of such a device 10 is represented in FIG. 48, which may be understood as corresponding substantially to FIG. 10 discussed previously. In this perspective, use of the reference 20' is intended to indicate that there are already present on the circuit support or PCB one or more of the layers or coatings 40, 40', 50 described previously. Hence, as may be noted, the casing body of the device 10 of FIG. 48 basically consists of just the portion 15, for connection and/or control of the device, which encloses the corresponding region 25 at least partially (see FIG. 8) of the coated PCB 20'.

In embodiments of the type exemplified in FIGS. 47 and 48, fixing of the sensor device 10 to the wall 5 of the tank can be obtained using a layer of bonding agent that is spread over the face of the device (and hence of the coated PCB 20') that is to face the tank 1. Such a layer of bonding agent is designated by G in FIG. 49. In the example, the layer G, which may advantageously itself perform insulation functions, is applied so as to coat the face of the coated PCB 20' where the detection electrodes are located, except for the part thereof contained in the portion 15. In general, the layer of bonding agent G may be spread on at least part of an outer layer or coating that protects a corresponding face of the PCB 20, the outer layer or coating possibly being, according to the cases, a layer $20_3$ or 40 or 40' or 50.

Also in embodiments of the type exemplified in FIGS. 47-48, in addition or as an alternative to the layer of bonding agent G, other fixing means may be used, such as separate brackets.

As already mentioned, in various embodiments, installation of the sensor device on the tank may be of an elastic type in order to enable compensation of possible production tolerances or process spread, and/or prevent any damage or failure following upon possible deformation and consequent thrust exerted by the wall of the tank on the sensor device (for example, following upon deformations due to temperature or heating of the vehicle standing in the sun, or on account of freezing and deformations of the walls of the tank, also as a result of expansion of the liquid inside the tank itself). For this purpose, the bonding agent set between the sensor device and the wall of the tank could be of an elastic type. As has been said, moreover, also an outer layer or coating—such as the layer or coating 40'—may advantageously present characteristics of elasticity that may prove useful for this purpose.

From the foregoing description the characteristics of the present invention emerge clearly, as do its advantages, mainly represented by the simplicity of construction of the level-sensor device proposed, its contained cost, and its precision and reliability.

It is clear that numerous variants may be made by the person skilled in the branch to the devices and methods described herein purely by way of example, without thereby departing from the scope of the invention as defined by the annexed claims.

The number of insulation layers may be smaller than the one illustrated in the figures, considering that the electrodes J are located in a position corresponding to just one side of the PCB 20. In this perspective, for example, just one of the outermost layers 20₃ of the PCB 20 may be exploited for the purposes of the invention and/or just one layer 40 (and/or 40') may be provided on the side of interest of the PCB 20, in particular when the outer casing 30 that protects the PCB is provided on the opposite side and on the lateral edges. On the other hand, as has been illustrated, the insulating structure may comprise layers 40 (and/or 40'), and/or 50 also on the side of the PCB where the level-detection electrodes are not present.

The PCB of the sensor device according to the invention does not necessarily have to be made using an epoxy-based material or a material including silicon or its derivatives or compounds. In possible variant embodiments, the PCB 20—even one not having a multilayer structure—may be obtained using, for example, a fluorinated polymer or PTFE, or a polyimide, or ceramic materials.

The invention has been described with particular reference to detection of the level of a liquid medium, in particular water or a urea-and-water-based additive, but as already mentioned the sensor described can be used in combination with different substances and materials, even ones potentially subject to solidification by freezing.

In some applications, it is possible for a level measurement with different areas of detection to be required, each of which has a different measurement resolution and which are located in different positions of the detection part 11 of the device 10. This need leads, for example, to positioning electrodes having different geometries—in terms of shape and size—along the detection region 24 of the PCB 20 in order to guarantee the resolution or tolerance of measurement required in the given area. This choice is in some cases limited by the need to minimise the cost of the control electronics of the device, and in particular of a controller thereof (which is linked to the number of its inputs and hence to the number of electrodes that it is able to manage). For this reason, in some applications, it may prove convenient to increase the size of the electrodes in the areas where maximum resolution of detection is not necessary (typically at the two ends). In this perspective, according to possible variant embodiments, the array of capacitive elements provided in a position corresponding to a major face of the PCB 20, in its detection region 24, may comprise a number of series of electrodes J diversified from one another in terms of shapes and/or size.

Individual characteristics described with reference to embodiments described previously may be combined with one another in other embodiments.

Reference has previously been made to functions of mechanical compensation performed by one or more insulation layers or coatings, which are, for example, made of materials with a base of fluorine derivatives or compounds, or else of elastomers not necessarily including fluorine derivatives or compounds. Layers or coatings of this type, owing to their elastic and/or compliant nature may extend or be provided also in regions of the PCB different from the detection region, such as the regions 25 and/or 26, in particular in order to coat and protect possible electrical and/or electronic components mounted in an exposed position on a circuit support or substrate.

As has been mentioned, on the circuit support of the device according to the invention there may be provided at least one temperature sensor, which, like the electrodes J, may be insulated from the liquid undergoing level detection by at least two layers of material (50, 40, 40', 20₃).

The invention claimed is:

1. A capacitive level-sensor device, for detecting the level of a medium contained in a container, wherein the device is configured for being installed on the outside of the container, in a position substantially resting against a wall of the container,
   wherein the device comprises a circuit support, which extends longitudinally substantially according to a level-detection axis, the circuit support having a first longitudinal end and a second longitudinal end,
   wherein the circuit support has a supporting structure, the supporting structure having a first longitudinal major side and a second longitudinal major side opposite to each other, as well as two opposite longitudinal edges,
   wherein the supporting structure of the circuit support has, in a detection region thereof that includes said first longitudinal end, at least one first plurality of first capacitive elements, which comprise at least one first array of first electrodes, the first electrodes being made of an electrically conductive material and being arranged at least in part in a position corresponding to the first longitudinal major side of the supporting structure of the circuit support,
   wherein the first electrodes are covered by at least one insulation or protection layer which is made of an electrically insulating and sealing material,
   wherein the at least one insulation or protection layer comprises a layer made of a material selected from materials that include silicon, or its derivatives or compounds, or materials that include fluorine derivatives or compounds,
   wherein the at least one insulation or protection layer comprises at least one first insulation or protection layer that surrounds at least one portion of the supporting structure of the circuit support to cover said first longitudinal major side, said second longitudinal major side and said two opposite longitudinal edges,
   wherein the device has a body that comprises an outer casing made at least in part of an electrically insulating material that is different from the material of the at least one first insulation or protection layer,
   wherein the outer casing is a casing moulded over the supporting structure provided with the at least one first insulation or protection layer, the outer casing surrounding only partially the supporting structure provided with the at least one first insulation or protection layer so as to leave exposed at least one part of the detection region that is to face the aforesaid wall of the container and that includes said first longitudinal major side of the supporting structure of the circuit support provided with a corresponding portion of the at least one first insulation or protection layer.

2. The device according to claim 1, wherein the at least one first insulation or protection layer comprises at least one layer substantially made of silicon oxide.

3. The device according to claim 2, wherein the at least one first layer substantially made of silicon oxide is formed starting from a composition including a silazane, or a polysilazane, or perhydropolysilazane.

4. The device according to claim 2, wherein the supporting structure of the circuit support is a multilayer supporting structure that comprises a plurality of structural layers of electrically insulating material, and wherein the at least one insulation or protection layer comprises at least one of said structural layers of electrically insulating material belonging to the multilayer supporting structure of the circuit support.

5. The device according to claim 4, wherein the at least one insulation or protection layer comprises the at least one first layer substantially made of silicon oxide and the at least one of said structural layers of electrically insulating material belonging to the multilayer supporting structure of the circuit support, the at least one of said structural layers of electrically insulating material belonging to the multilayer supporting structure of the circuit support being in a position intermediate between the first electrodes and the at least one first layer substantially made of silicon oxide.

6. The device according to claim 1, wherein the at least one first insulation or protection layer comprises at least one layer including a fluoropolymer.

7. The device according to claim 1, wherein the at least one insulation or protection layer comprises at least one said first layer made of a material that includes silicon, or its derivatives or compounds, and at least one said first layer made of a material that includes fluorine derivatives or compounds.

8. The device according to claim 6, wherein the supporting structure of the circuit support is a multilayer supporting structure that comprises a plurality of structural layers of electrically insulating material, and wherein the at least one insulation or protection layer comprises at least one of said structural layers of electrically insulating material belonging to the multilayer supporting structure of the circuit support.

9. The device according to claim 1, wherein the at least one insulation or protection layer further comprises at least one layer of epoxy-based material.

10. The device according to claim 1, wherein the supporting structure of the circuit support is made at least in part of an epoxy-based material, or a composite material having an epoxy-resin matrix.

11. The device according to claim 10, wherein the composite material includes glass fibres in an epoxy-resin matrix.

12. The device according to claim 1, wherein the supporting structure of the circuit support is a multilayer supporting structure that comprises a plurality of structural layers of electrically insulating material, the first electrodes being arranged between two of said structural layers of electrically insulating material of the multilayer supporting structure.

13. The device according to claim 1, wherein the first electrodes are spaced from one another along the level-detection axis.

14. The device according to claim 1, wherein the at least one first insulation or protection layer comprises at least one first surrounding layer made of a material that includes silicon, or its derivatives or compounds, and at least one second surrounding layer made of a material that includes fluorine derivatives or compounds, both the first surrounding layer and the second surrounding layer surrounding said at least one portion of the supporting structure of the circuit support at said first longitudinal major side, said second longitudinal major side and said two opposite longitudinal edges.

15. A method for obtaining a capacitive level-sensor device, for detecting the level of a medium contained in a container, the method comprising:

i) providing a circuit support made of electrically insulating material, which extends longitudinally substantially according to a level-detection axis, the circuit support having a supporting structure with a first longitudinal major side and a second longitudinal major side opposite to each other, as well as two opposite longitudinal edges, the supporting structure being provided, in a detection region thereof, with a plurality of capacitive elements that include at least one array of electrodes in a position corresponding to said first longitudinal major side of the supporting structure of the circuit support, ii) covering at least partially with an electrically insulating and sealing material the detection region of the supporting structure of the circuit support, with at least one insulation or protection layer made of an electrically insulating material that is selected from materials including silicon, or its derivatives or compounds, or materials including fluorine derivatives or compounds, the at least one insulation or protection layer comprising at least one first insulation or protection layer surrounding at least one portion of the supporting structure of the circuit support at said first longitudinal major side, said second longitudinal major side and said two opposite longitudinal edges, and iii) moulding over the supporting structure provided with the at least one first insulation or protection layer thereon an outer casing made of an electrically insulating material that is different from the material of the at least one first insulation or protection layer, the outer casing surrounding only partially the supporting structure provided with the at least one first insulation or protection layer, so as to leave exposed at least one part of the detection region that includes said first longitudinal major side of the supporting structure of the circuit support provided with a corresponding portion of the at least one first insulation or protection layer.

16. A capacitive level-sensor device, for detecting the level of a medium contained in a container, wherein the device is configured for being installed on the outside of the container, in a position substantially resting against a wall of the container, the device comprising:
a circuit support made of electrically insulating material, which extends longitudinally substantially according to a level-detection axis, the circuit support having a multilayer supporting structure that comprises a plurality of structural layers of electrically insulating material, the multilayer supporting structure having two opposite longitudinal outer major sides and two opposite longitudinal outer minor sides;
a first array of electrodes or capacitive elements in a detection region of the circuit support, the first array of electrodes or capacitive elements comprising at least one series of electrodes in a position corresponding to a first side of the circuit support; and
at least one covering layer made of an electrically insulating and sealing material, which covers the electrodes of the at least one series;
and wherein:
the at least one covering layer comprises at least one of a first layer substantially of silicon oxide and a first layer including a fluoropolymer, with the electrodes being arranged between two structural layers of electrically insulating material of the multilayer supporting structure, the at least one covering layer surrounding the multilayer supporting structure of the circuit support so as to cover said two opposite longitudinal outer major sides and said two opposite longitudinal outer minor sides at least at the detection region, or else the at least one covering layer comprises at least one of a first layer including a fluoropolymer and a first layer of epoxy-based material, with the electrodes being arranged at an outer face of the multilayer supporting structure of the circuit support, the at least one covering layer surrounding the multilayer supporting structure of the circuit support so as to cover said two opposite longitudinal outer major sides and said two opposite longitudinal outer minor sides at least at the detection region.

* * * * *